US007738286B2

United States Patent
Ito et al.

(10) Patent No.: US 7,738,286 B2
(45) Date of Patent: Jun. 15, 2010

(54) MAGNETIC MEMORY DEVICE

(75) Inventors: Kenchi Ito, Cambridge (GB); Hiromasa Takahashi, Tokyo (JP); Takayuki Kawahara, Tokyo (JP); Riichiro Takemura, Tokyo (JP); Thibault Devolder, Massy (FR); Paul Crozat, Les Ulis (FR); Joo-von Kim, Mass (FR); Claude Chappert, Garches (FR)

(73) Assignees: Hitachi, Ltd., Tokyo (JP); Centre National de la Recherche Scientifique, Paris (FR); Universite Paris Sud XI, Orsay (FR)

( * ) Notice: Subject to any disclaimer, the term of this patent is extended or adjusted under 35 U.S.C. 154(b) by 385 days.

(21) Appl. No.: 11/638,379

(22) Filed: Dec. 14, 2006

(65) Prior Publication Data

US 2008/0037179 A1    Feb. 14, 2008

(30) Foreign Application Priority Data

| May 4, 2006 | (EP) | ................................. 06113534 |
| Aug. 3, 2006 | (EP) | ................................. 06118378 |

(51) Int. Cl.
  *G11C 11/00* (2006.01)
(52) U.S. Cl. ...................... 365/158; 365/171; 365/173; 365/148; 977/935
(58) Field of Classification Search ................. 365/148, 365/158, 171, 173, 48, 66, 78, 80–93, 100, 365/130, 131, 225.5, 243.5; 257/421, E21.665; 438/3; 977/933–935; 216/22
  See application file for complete search history.

(56) References Cited

U.S. PATENT DOCUMENTS

| 6,169,689 | B1 * | 1/2001  | Naji  ........................... 365/173 |
| 6,545,906 | B1 * | 4/2003  | Savtchenko et al.  ......... 365/158 |
| 6,639,830 | B1   | 10/2003 | Heide |
| 6,667,899 | B1 * | 12/2003 | Subramanian et al.  ...... 365/158 |
| 6,711,052 | B2 * | 3/2004  | Subramanian et al.  ...... 365/158 |
| 6,714,444 | B2 * | 3/2004  | Huai et al.  .................. 365/171 |
| 6,714,446 | B1 * | 3/2004  | Engel  ......................... 365/171 |
| 6,753,562 | B1   | 6/2004  | Hsu et al. |
| 6,816,402 | B2 * | 11/2004 | Deak  .......................... 365/158 |

(Continued)

FOREIGN PATENT DOCUMENTS

TW          481784        4/2002

OTHER PUBLICATIONS

Partial European Search Report, EP 06118378, Dec. 4, 2007.

(Continued)

*Primary Examiner*—Richard Elms
*Assistant Examiner*—Harry W Byrne
(74) *Attorney, Agent, or Firm*—Antonelli, Terry, Stout & Kraus, LLP.

(57) ABSTRACT

A magnetic memory device comprises a magnetic tunnel junction (MTJ) connecting to a bit line to a sense line through an isolation transistor. The MTJ includes a ferromagnetic layer having a magnetic hard axis. An assist current line overlies the bit line and is insulated from the bit line. The MTJ is switchable between a first, relatively high resistance state and a second, relatively low resistance state. The assist current line applies a magnetic field along the magnetic hard axis in the ferromagnetic layer, independently of current flow through the MTJ for assisting switching of the MTJ between the first and second states.

6 Claims, 17 Drawing Sheets

U.S. PATENT DOCUMENTS

| | | | |
|---|---|---|---|
| 6,937,497 B1* | 8/2005 | Ju et al. | 365/130 |
| 6,956,763 B2* | 10/2005 | Akerman et al. | 365/158 |
| 6,956,764 B2* | 10/2005 | Engel et al. | 365/158 |
| 6,987,692 B2* | 1/2006 | Smith et al. | 365/173 |
| 6,992,910 B1* | 1/2006 | Ju et al. | 365/130 |
| 7,006,375 B2* | 2/2006 | Covington | 365/173 |
| 7,054,186 B2* | 5/2006 | Iwata | 365/158 |
| 2003/0007398 A1 | 1/2003 | Daughton et al. | |
| 2003/0214862 A1 | 11/2003 | Asao et al. | |
| 2004/0001360 A1 | 1/2004 | Subramanian et al. | 365/188 |
| 2004/0228198 A1 | 11/2004 | Shimizu et al. | |
| 2004/0233760 A1* | 11/2004 | Guo et al. | 365/222 |
| 2004/0246775 A1* | 12/2004 | Covington | 365/173 |
| 2005/0073882 A1* | 4/2005 | Smith et al. | 365/173 |
| 2005/0106810 A1* | 5/2005 | Pakala et al. | 438/257 |
| 2005/0237793 A1 | 10/2005 | Min et al. | |
| 2006/0017082 A1* | 1/2006 | Fukuzumi et al. | 257/295 |

OTHER PUBLICATIONS

European Search Report, EP 06118378, Feb. 1, 2008.
Taiwanese Office Action dated Mar. 3, 2009 in Appln. No. 95146660; and English language translation.
IEEE Transactions on Magnetics, Vo. 36, No. 5 Sep. 2000; Recent Developments in Magnetic Tunnel Junction MRAM; Tehrani et al. pp. 2752-2757.
The American Physical Society, vol. 54, No. 13; Emission of Spin Waves by a Magnetic Multilayer Traversed by a Current; L. Berger pp. 9353-9358.
2005 Symposium on VLSI technology Digest of Technical Papers; Highly Scalable MRAM Using Field Assisted Current Induced Switching pp. 184-185.
A Novel Nonvolatile memory with Spin Torque Transfer magnetization Switching: Spin-RAM; M. Hosomi et al.
Applied Physics Letters 88; Magnetization Switching by Spin Torque using Subnanosecond Current Pulses Assisted by Hard Axis Magnetic Fields: T. Devolder et al.

* cited by examiner

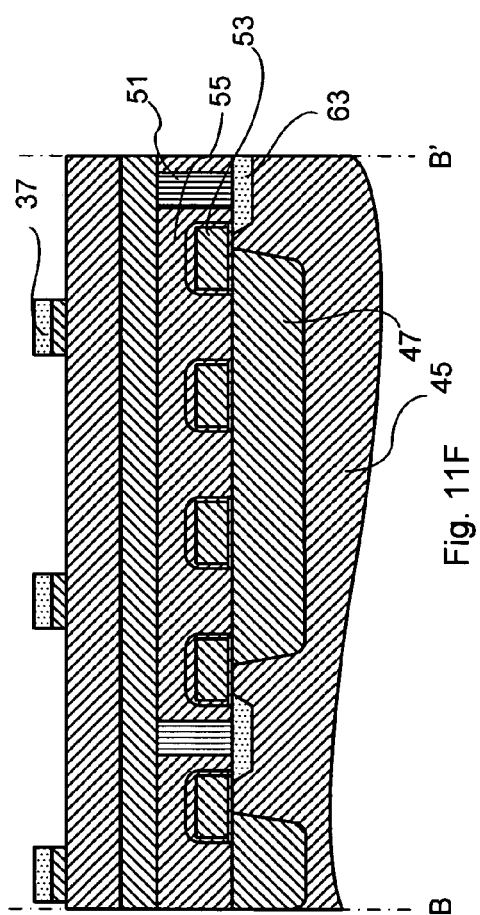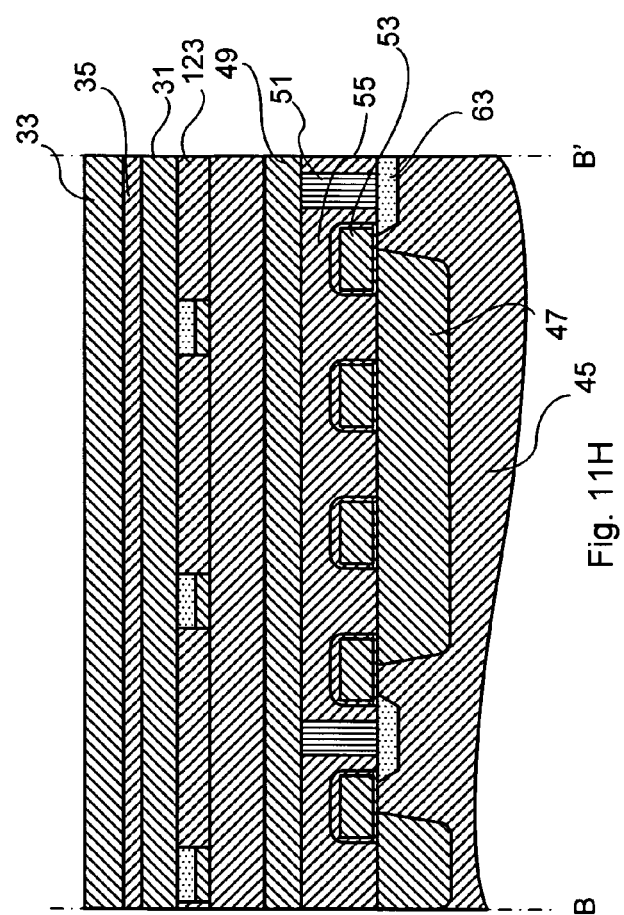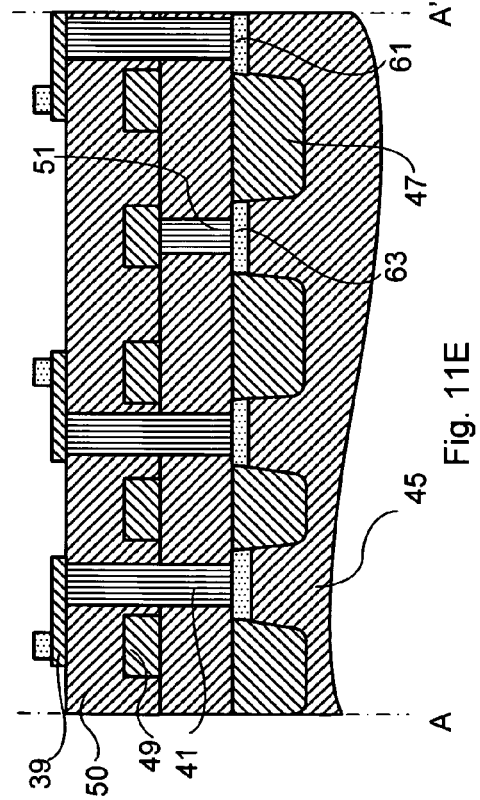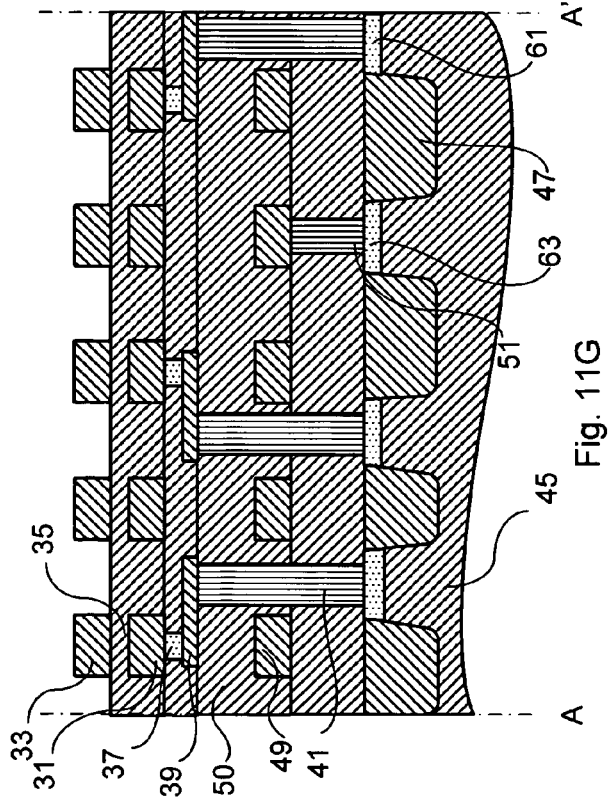

MAGNETIC MEMORY DEVICE

FIELD OF THE INVENTION

The present invention relates to a magnetic memory device and in particular, although not exclusively, to a magnetic random access memory. The present invention relates also to a method of writing to a magnetic memory device.

BACKGROUND ART

The emergence of magnetic random access memory (MRAM) is a promising step for the development of both long-term and short-term data storage. MRAM has the benefit of being non-volatile, while having a lower energy consumption and faster read and write time than Flash memory. MRAM also has a lower energy consumption than the commonly used volatile memories dynamic RAM (DRAM) and static RAM (SRAM), with a read and write time faster than that of DRAM.

A conventional MRAM cell comprises a magnetic element having a ferromagnetic free layer and a ferromagnetic pinned layer, separated by a non-magnetic layer. The pinned layer has a relatively high coercivity, so that its magnetisation remains fixed upon the application of a writing magnetic field. The free layer has a relatively low coercivity, so that its magnetisation can be changed upon application of the writing magnetic field.

To write to the MRAM cell, the writing magnetic field is applied to switch the magnetisation of the free layer to be either parallel or anti-parallel to the pinned layer. The free layer exhibits magnetic hysteresis, thus its magnetisation remains unchanged when the magnetic field is removed. This results in a non-volatile memory.

To read the state of the MRAM cell, a small current is driven through the magnetic element. The magnetoresistance of the magnetic element will be higher when the magnetisations of the free layer and the pinned layer are antiparallel, than when the magnetisations of the free layer and the pinned layer are parallel. In this way, the state of the magnetic element can be determined by measuring its resistance.

A conventional MRAM is described in "Recent Developments in Magnetic Tunnel Junction MRAM" by S. Tehrani et al., p. 2752-2757, IEEE Transactions on Magnetics, Vol. 36, No. 5 (September 2000).

Such a conventional MRAM suffers from the disadvantage that as the size of the MRAM cell decreases, the magnetic field required to switch the magnetisation of the free layer increases. Therefore, the power consumption of the device increases as the cell size decreases.

Another technique used to write to a magnetic element is spin-transfer-torque (STT) switching. STT switching is described in "Current-driven Excitation of Magnetic Multilayers" by J. C. Slonczewski, p. 9353, Phys. Rev. B, Vol. 54 (1996). To switch the magnetisation of the free layer, instead of applying a magnetic field, a current is driven through the magnetic element perpendicular to the plane of the free and pinned layers. This can result in the injection of spin-polarised electrons into the free layer, either by electrons flowing through the pinned layer, when current is driven from the free layer to the pinned layer, or by electrons scattering from the pinned layer 85, when current is driven from the pinned layer to the free layer.

When spin polarised electrons are injected into the free layer, their spin angular momentum interacts with the magnetic moments in the free layer. The electrons transfer a portion of their angular momentum to the free layer. This results in switching the magnetisation of the free layer when the spin-polarised current is large enough.

An MRAM utilising STT switching is described in "Highly scalable MRAM using field assisted current induced switching" by W. C. Jeong et al., p. 184, 2005 Symposium on VLSI Technology Digest of Technical Papers.

The current required for STT switching decreases as the cell size decreases. Therefore, high density MRAM can be realised with STT switching. For DC current, the threshold current density for STT switching depends on material constants such as the saturation magnetisation, Gilbert's damping constant, and the spin polarisations of both the pinned and free layers. However, the required current for a nano-second pulse is much larger than the DC threshold current. It has been shown that the required current in the nano-second regime is given by $$I = I_{c0}(1 + C \cdot t_p^{-1}) \tag{1}$$

where C is a constant, and $I_{c0}$ is the DC threshold current. According to equation (1) above, the current required to switch the magnetisation for a 1 ns pulse is four times the DC threshold current. Therefore, STT switching MRAMs having a fast write time will have large power consumption.

Another MRAM is described in "A Novel Non-volatile Memory with Spin Torque Transfer Magnetization Switching: Spin-RAM" by M. Hosomi et al., p 19.1, IEEE International Electron Device Meeting 2005 also shows that the current required for STT switching increases significantly in the nano-second regime.

"Magnetization switching by spin torque using subnano-second current pulses assisted by hard axis magnetic fields" by T. Devolder et al., Appl. Phys. Lett., 88, pp. 152502 (2006) describes an experiment conducted using a pillar-shaped spin valve in which magnetisation switching is induced by spin transfer using nano-second current pulses combined with a fixed hard axis field.

The present invention seeks to provide an improved method of operating a magnetic memory device.

SUMMARY OF THE INVENTION

According to a first aspect of the present invention there is provided a magnetic memory device comprising: first and second leads; a magnetoresistive multilayer structure arranged between said leads such that current is conducted from the first lead to the second lead through layers of said multilayer structure, said multilayer structure exhibiting a first, relatively high resistance state and a second, relatively low resistance state, said multilayer structure including a first ferromagnetic layer having a magnetic hard axis and a magnetic easy axis, and said multilayer structure being switchable between said first and second states; and characterised by a magnetic field source for controllably applying a magnetic field along the magnetic hard axis in the ferromagnetic layer independently of current flow through the multilayer structure for assisting switching of the multilayer structure between first and second states.

In such a magnetic memory device, a lower switching current can be used. In turn, this can lead to an increase in writing speed for a given current.

The multilayer structure may comprise a magnetic tunnel junction, the magnetic tunnel junction comprising said first ferromagnetic layer, a second region and an insulating layer separating the first ferromagnetic layer and the second region. This can increase the ratio of magnetoresistance of the relatively high resistance state and the relatively low resistance state.

The first ferromagnetic layer may have a relatively low coercivity and the second region may comprise a synthetic anti-ferromagnetic (SAF) layer, having a relatively high coercivity; wherein the SAF layer comprises: a first ferromagnetic sub-layer; a second ferromagnetic sub-layer, with a magnetisation of substantially equal magnitude and anti-parallel to the magnetisation of first ferromagnetic layer; and an anti-ferromagnetic coupling sub-layer separating the first ferromagnetic sub-layer and second ferromagnetic sub-layer, and wherein said multilayer structure further comprises an anti-ferromagnetic layer coupled to said SAF layer for pinning the magnetisation of the SAF layer, the SAF layer separating the insulating layer and the pinning layer.

The first ferromagnetic layer may have a relatively low coercivity and the second region may comprise a second ferromagnetic layer, having a relatively high coercivity.

The second ferromagnetic layer may be thicker than the first ferromagnetic layer.

The multilayer structure may further comprise an anti-ferromagnetic layer coupled to the second ferromagnetic layer for pinning the magnetisation of the second ferromagnetic layer, wherein the second ferromagnetic layer separates the insulating layer and the anti-ferromagnetic layer.

The multilayer structure may further comprise a third ferromagnetic layer, spaced from the first ferromagnetic layer, for spin-polarising electrons when current flows from the second ferromagnetic layer to the first ferromagnetic layer.

The multilayer structure may be formed in an upstanding pillar. The pillar may have an elliptical base having short and long axes, wherein the magnetic hard axis of the first ferromagnetic layer is directed along the short axis. The ratio of the axes may be in the range 1:1.5 to 1:2.5. The ratio of the axes may be 1:2.

The magnetic field source may comprise an elongate conductor having a longitudinal axis arranged parallel to the easy axis of the first ferromagnetic layer.

The elongate conductor may be a wire. The elongate conductor may be formed of a metal. The elongate conductor may be formed of an alloy. The elongate conductor may have a thickness between 10 nm and 100 nm. The elongate conductor may have width between 10 nm and 100 nm.

The elongate conductor may pass less than 200 nm from the first ferromagnetic layer. The elongate conductor may pass between 20 nm and 100 nm from the first ferromagnetic layer.

The conductor may be configured such that when a current passes through the conductor in response to a bias of the order of 1 V applied across the conductor, a magnetic field of between 0.1 to 0.2 of an anisotropy magnetic field of the first ferromagnetic layer is generated in the first ferromagnetic layer.

The conductor may be configured such that when a current passes through the conductor in response to a bias of the order of 1 V applied across the conductor, a magnetic field of at least 20 Oe is generated in the first ferromagnetic layer.

The conductor may be configured such that when a current passes through the conductor in response to a bias of the order of 1 V applied across the conductor, a magnetic field of between 20 Oe to 50 Oe is generated in the first ferromagnetic layer.

According to a second aspect of the present invention, there is provided a magnetic random access memory (MRAM) comprising: an array of the magnetic memory devices, wherein each multilayer structure connects a one of said first leads with a one of said second leads; and a third set of leads, such that each multilayer structure is addressable by one of said first or second leads and one of said third set of leads.

According to a third aspect of the present invention there is provided an MRAM comprising: a first, second and thirds sets of leads; an array of magnetoresistive multilayer structures, each magnetoresistive multilayer structure connecting a one of said first set of leads with a one of said second set of leads, such that each multilayer structure is addressable by one of said first or second set of leads and one of said third set of leads, said multilayer structure exhibiting a first, relatively high resistance state and a second, relatively low resistance state, said multilayer structure including a ferromagnetic layer having a magnetic hard axis and a magnetic easy axis, and said multilayer structure being switchable between said first and second states; and characterised by a plurality of magnetic field sources, each for controllably applying a magnetic field along the magnetic hard axis in the ferromagnetic layer of at least one of said array of magnetoresistance multilayer structures, independently of current flow through the multilayer structures for assisting switching of the multilayer structures between first and second states.

Each of said first leads and each of said second leads may be shared between a column of the array. Each of said third leads may be shared between a tow of the array.

The MRAM may further comprise an array of isolation transistors, wherein each of said multilayer structures is connected to the source or drain of one of said isolation transistors by one of said first leads or one of said second leads, and each of said third leads is connected to the base of the isolation transistors in a row of the array.

A magnetic field source may be provided for each column of the array, and wherein each magnetic field source comprises an elongate conductor having a longitudinal axis arranged parallel to the magnetic easy axis of the ferromagnetic layers.

According to a fourth aspect of the present invention there is provided a method of writing to a magnetic memory device, the magnetic memory device comprising: first and second leads; a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis, and said multilayer structure being switchable between said first and second states; and characterised by a magnetic field source for controllably applying a magnetic field along the magnetic hard axis in the ferromagnetic layer independently of current flow through the multilayer structure for assisting switching of the multilayer structure between first and second states, said method comprising: applying a magnetic field along the magnetic hard axis in the ferromagnetic layer using the magnetic field source; applying a bias between the first lead and the second lead to drive a current through the magnetoresistive multilayer structure; removing said magnetic field; and removing said bias, wherein applying the magnetic field occurs before the step of applying the bias.

Applying the magnetic field may occur at least 1 ns before applying the bias.

Removing the magnetic field may occurs before removing the bias.

Applying the bias may occurs 2 ns after applying the magnetic field, removing the magnetic field may occurs 3 ns after applying the magnetic field, and removing said bias may occur 6 ns after applying the magnetic field.

The magnitude of the applied magnetic field in the ferromagnetic layer may be between 0.1 to 0.2 of an anisotropy magnetic field of the first ferromagnetic layer.

According to a fifth aspect of the present invention there is provided a method of operating a magnetic memory device, the magnetic memory device comprising first and second leads, a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis, and said multilayer structure being switchable between said first and second states, and a magnetic field source for controllably applying a magnetic field along the magnetic hard axis in the ferromagnetic layer independently of current flow through the multilayer structure for assisting switching of the multilayer structure between first and second states, said method comprising turning on a magnetic field along the magnetic hard axis in the ferromagnetic layer using the magnetic field source and turning on a current through the magnetoresistance multilayer structure within 0 to 5 ns after turning on the magnetic field.

According to a sixth aspect of the present invention there is provided a method of operating a magnetic memory device, the magnetic memory device comprising first and second leads, a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis, and said multilayer structure being switchable between said first and second states, and a magnetic field source for controllably applying a magnetic field along the magnetic hard axis in the ferromagnetic layer independently of current flow through the multilayer structure for assisting switching of the multilayer structure between first and second states, said method comprising turning on a magnetic field along the magnetic hard axis in the ferromagnetic layer using the magnetic field source and turning on a current through the magnetoresistance multilayer structure within a time $\Delta t$, such that $\Delta t < t_{damp}$, where:

$$t_{damp} \approx \frac{1}{2\pi\alpha f}$$

where $\alpha$ is a damping constant and f is a frequency of precession caused by turning on the magnetic field.

This can allow an even lower switching current through the magnetoresistive multilayer structure to be used.

The method may comprise turning on a current through the magnetoresistance multilayer structure within 0 to 3 ns or between 0 and 2 ns after turning on the magnetic field.

According to a seventh aspect of the present invention there is provided a memory comprising: a magnetic memory device comprising: first and second leads; a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis; and a magnetic field source for controllably applying a magnetic field along the magnetic hard axis in the ferromagnetic layer independently of current flow through the multilayer structure for assisting switching of the multilayer structure between first and second states; and circuitry for controlling the magnetic memory device configured to perform the method.

BRIEF DESCRIPTION OF THE DRAWINGS

Embodiments of the present invention will now be described, by way of example, with reference to FIGS. 3A to 18 of the accompanying drawings in which:

FIGS. 11A to 11H show a method of fabricating the device shown in FIG. 3A;

CONVENTIONAL MRAM

Device Layout

Figure 1:
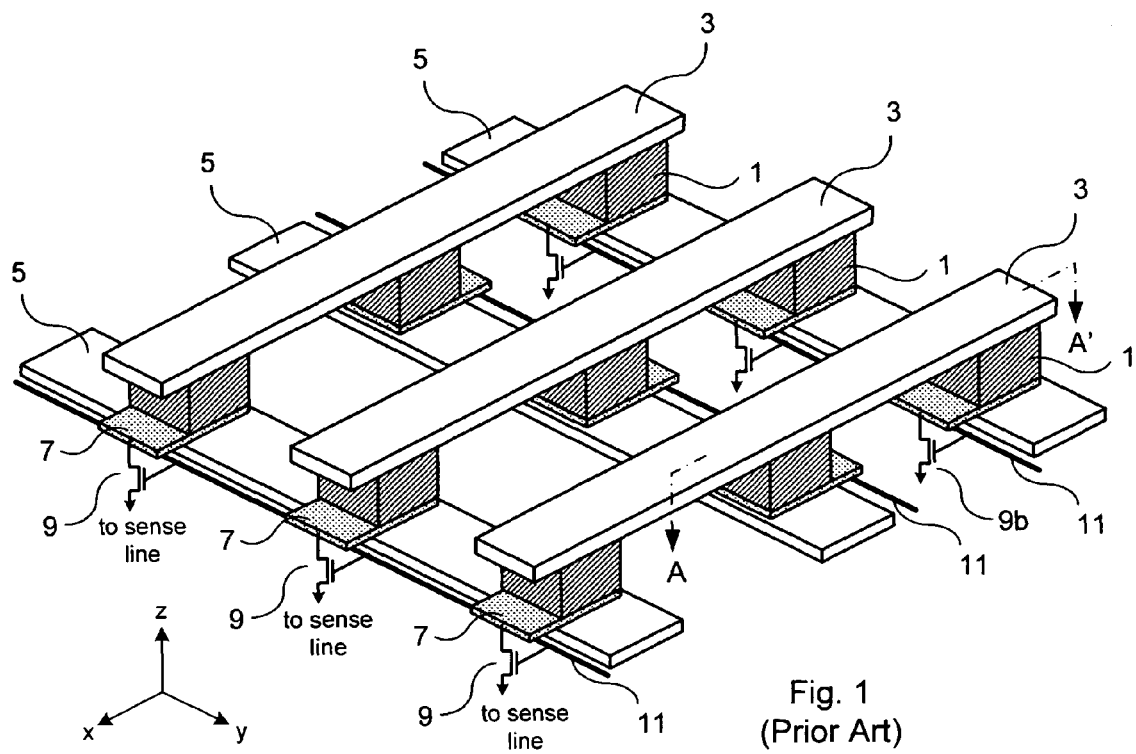
FIG. 1 is a schematic of a prior art magnetic random access memory (MRAM) array.

Referring to FIG. 1, a schematic of a prior art MRAM array is shown. The MRAM array is arranged in a cross-point architecture, with a magnetic tunnel junction (MTJ) 1 between each intersection of one of a plurality of bit lines 3 and one of a plurality of digit lines 5 arranged perpendicular to the bit lines 3. Therefore, each row of the array is defined by a bit line 3 and each column of the array is defined by a digit line 5.

The MTJ 1 is in electrical contact with the bit line 3. However, the MTJ 1 is electrically isolated from the digit line 5 by an insulating matrix 18.

The MTJ 1 has a magnetic easy axis in the plane of the MTJ 1 (defined herein as the x-y plane) and a magnetic hard axis in the plane of the MTJ 1. In this example, the magnetic easy axis is defined to be parallel to the x-axis, and the magnetic hard axis is defined to be parallel to the y-axis. The bit line 3 is aligned parallel to the easy axis of the MTJ 1 i.e. aligned parallel to the x-axis. The digit line 5 is aligned parallel to the hard axis of the MTJ 1 i.e. aligned parallel to the y-axis.

Each MTJ 1 is disposed on a bottom electrode 7. Each bottom electrode 7 is connected to an isolation transistor 9, 9a, 9b. Each isolation transistor 9, 9a, 9b is connected to a sense line (not shown). Word lines 11 run parallel to the digit lines 5 i.e. parallel to the y-axis. Each word line 11 is connected to the gate of all the transistors 9, 9a, 9b in a single column.

Figure 2:
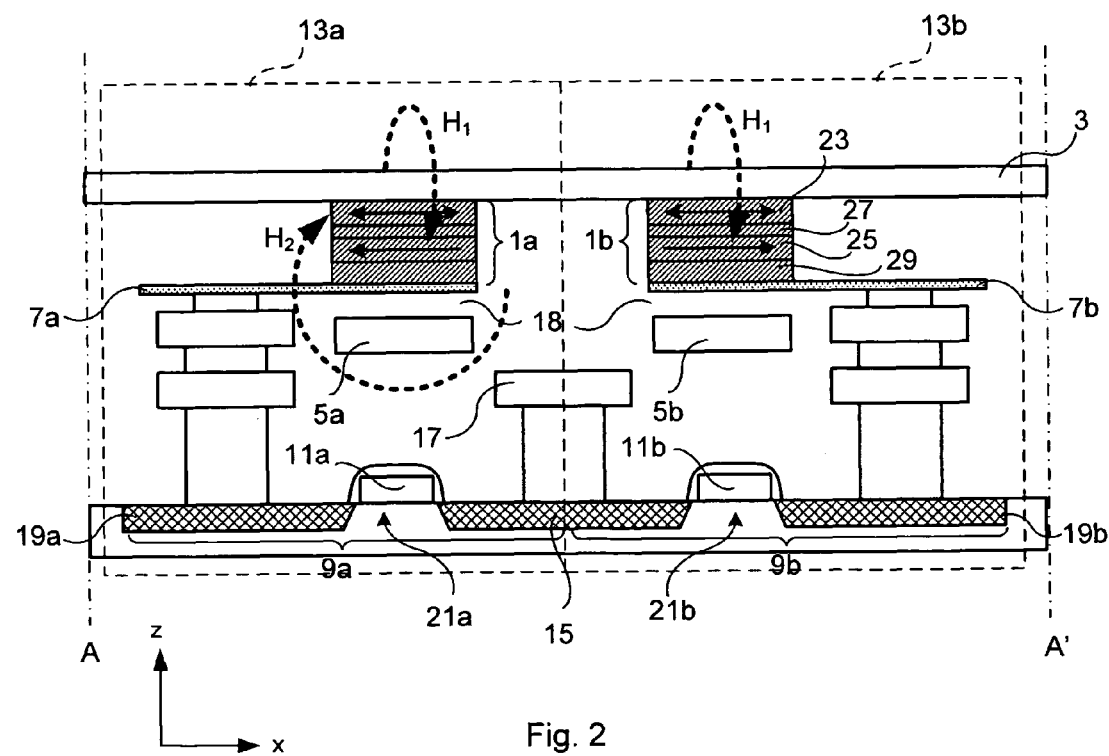
FIG. 2 is a cross-section of two neighbouring prior art MRAM cells taken along a line A-A'.

FIG. 2 is a cross-section through two neighbouring memory cells of a row of the MRAM array, taken along the line A-A'. Each memory cell 13a, 13b is formed of one transistor 9a, 9b and one MTJ 1a, 1b. To minimise the cell area, a source 15 of each isolation transistor 9a, 9b is shared between neighbouring cells 13a, 13b. A sense line 17 is connected to the source 15 of the isolation transistor 9a, 9b.

As described above, both MTJs 1a, 1b are connected to the bit line 3. Each MTJ 1a, 1b is connected via a respective bottom electrode 7a, 7b to a drain 19a, 19b of the transistor 9a, 9b. A word line 11a, 11b is connected to a gate 21a, 21b of each transistor 9a, 9b. A digit line 5a, 5b runs underneath each MTJ 1a, 1b. The digit line 5a, 5b is separated from the bottom electrode 7a, 7b by an insulating matrix 18.

Each MTJ 1a, 1b comprises a free layer 23, a pinned layer 25, and a thin dielectric barrier 27 between the free layer 23 and the pinned layer 25. A pinning layer 29 is coupled to the pinned layer 25. The free layer 23 is a ferromagnetic layer having a relatively low coercivity. The pinned layer 25 is a ferromagnetic layer having a relatively high coercivity. The dielectric barrier 27 has a thickness such that electrons can tunnel through it. The pinning layer 29 is an antiferromagnetic layer and prevents the magnetisation of the pinned layer 25 from switching.

The dielectric barrier 27 comprises aluminium oxide ($AlO_x$) and has a thickness of about 20 Å. The free layer 23 and the pinned layer 25 are formed of nickel iron (NiFe). The pinning layer 29 can be formed of iron manganese (FeMn) or iridium manganese (IrMn).

Device Operation

Reading and writing of the prior art memory cell will now be described.

To write to the memory cell 13a, no bias is applied to the word line 11a, so that the transistor 9a is switched off. Therefore, no current can flow through the MTJ 1a.

A current is then driven through the bit line 3. This generates a magnetic field $H_1$ along the magnetic hard axis of both MTJ 1a and MTJ 1b. A current is also driven through the digit line 5a. This generates a magnetic field $H_2$ along the magnetic easy axis of the MTJ 1a.

The field $H_1$ generated by the bit line 3 is about half the field required to switch the magnetisation of the free layer 23. The field $H_2$ generated by the digit line 5a is also about half the field required to switch the magnetisation of the free layer 23. The sum of the two magnetic fields $H_1$ and $H_2$ is just over the switching threshold of the free layer 23.

Therefore, the magnetic field generated around the MTJ 1b is insufficient to cause switching of the free layer 23. However, the magnetic field generated around the MTJ 1a is sufficient to cause switching of the free layer 23. In this way, only a single MTJ 1a is switched by driving current through the bit line 3 corresponding to the row of the MTJ 1a and through the digit line 5a corresponding to the column of the MTJ 1a.

The sum of the magnetic fields $H_1$ and $H_2$ is insufficient to cause switching of the pinned layer 25.

To read the memory cell 13a, a bias is applied to the word line 11a, so that the transistor 9a is switched on. Therefore, current can flow through the MTJ 1a, and current is also able to flow through all the MTJs in the same column of the array. Then, a bias is also applied to the bit line 3. Therefore, current flows through the MTJ 1a in the column defined by the word line 11a and the row defined by the bit line 3.

The magnetoresistance of the MTJ 1a depends on the direction of magnetisation of the free layer 23. When the magnetisation of the free layer 23 is arranged parallel to the magnetisation of the pinned layer 25, there is an equal density of states across the dielectric barrier 27 for spin-up and spin-down electrons. This results in a high probability of tunnelling across the barrier 27, resulting in low resistance state.

When the magnetisation of the free layer 23 is arranged anti-parallel to the magnetisation of the pinned layer 25, the density of states across the barrier 27 is not equal for spin-up and spin-down electrons. This reduces the probability of tunnelling across the barrier 27, resulting in a high resistance state.

The resistance of the memory cell 13a is compared with an associated reference memory cell (not shown) through sense circuitry (not shown). In this way, the state of the memory cell 13a can be determined.

The size of the above-described memory cell 13a is limited by the available power. This is because, as the size of the MTJ decreases, the coercivity of the free layer 23 increases, increasing the current required through the bit lines 3 and the digit lines 5 to switch the memory cell 13a. In addition, when writing, half-selected MTJs (i.e. the MTJs in the column of the selected digit line or row of the selected bit line) have a reduced magnetic reversal energy barrier. This reduces the thermal stability of their free layers. Also, this writing method suffers from a small writing margin due to shape variations in the free layer.

As described above, STT switching MRAMs can reduce the required power for a given cell size. However, the current required for writing in the nano-second regime can be many times larger than the DC threshold current.

DETAILED DESCRIPTION OF EMBODIMENTS

First Embodiment

Device Layout

Referring to FIGS. 3A to 3D, a first memory array according to certain embodiments of the present invention is shown. The memory array is a magnetic random access memory (MRAM).

Figure 3A:
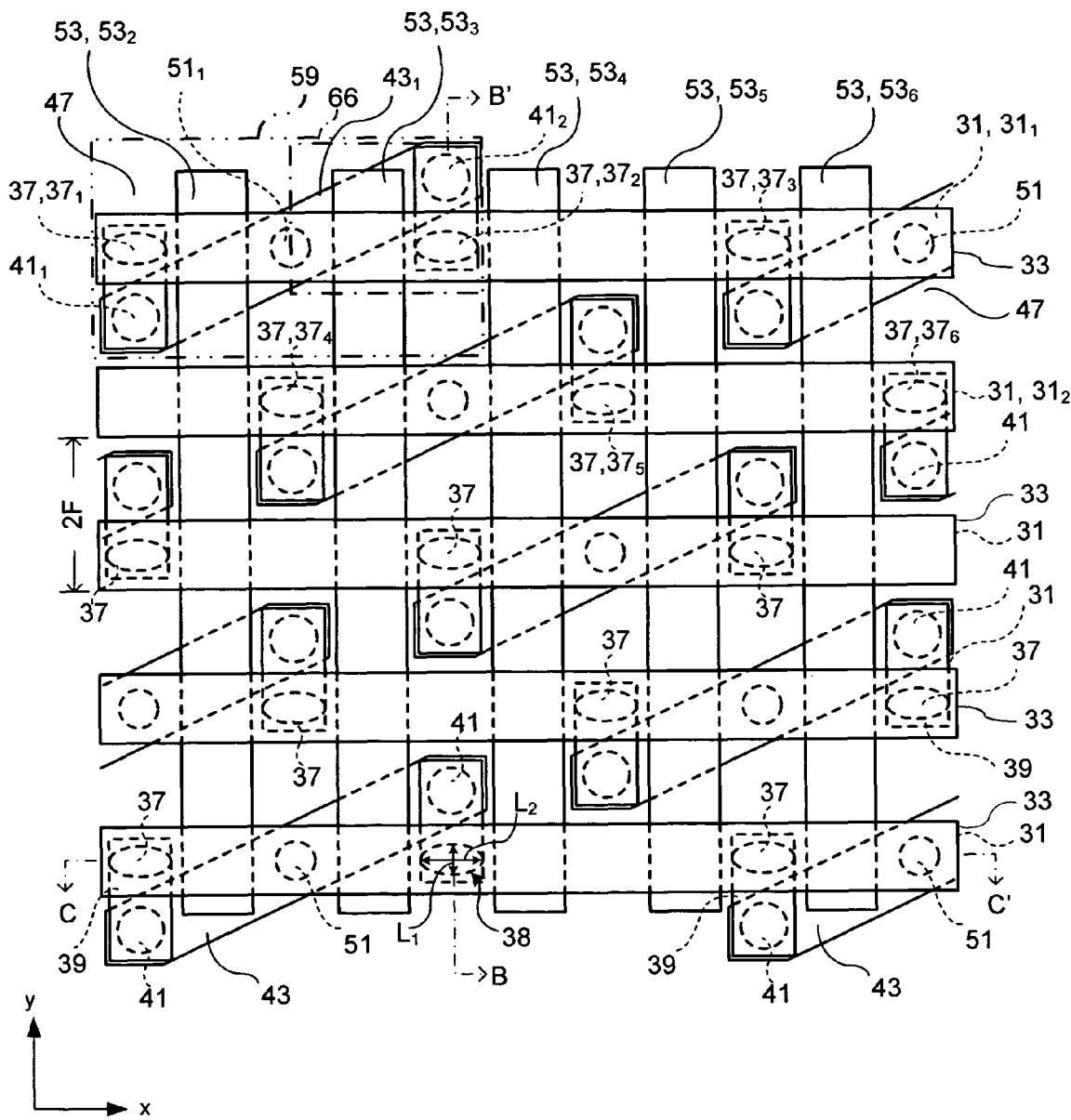
FIG. 3A is a plan view of a memory array comprising a magnetic memory device according to certain embodiments of the present invention.

Referring in particular to FIG. 3A, the memory array is made up of a plurality of word lines 53, defining a first dimension of the array, in this example columns of the array, and a plurality of bit lines 31, overlying and perpendicular to the word lines 53, defining a second dimension of the array, in this example rows of the array.

A plurality of magnetic tunnel junctions (MTJs) 37 having stacked layers are connected to the underside of each bit line 31, in spaces between the word lines 53.

The bit lines 31 are arranged in a first direction, herein defined as the x-axis. The word lines 53 are arranged in a second direction, herein defined as the y-axis Referring in particular to FIGS. 3B and 3C, a plurality of assist current lines 33 are arranged parallel to the x-axis. The assist current lines 33 overlie the bit lines 31 and are electrically isolated from the bit lines 31 by an insulating matrix 35.

As shown in FIG. 3A, each MTJ 37 is formed in a pillar defined by sidewalls 38 and has an elliptical base having a short axis $L_1$ and a long axis $L_2$. In this example, the pillar has a uniform cross section up its height i.e. a uniform cross section in the x-y plane. The difference in length between the long axis $L_2$ and the short axis $L_1$ provides magnetic shape anisotropy. In this example, the ratio of the short axis $L_1$ length to the long axis $L_2$ length is 1:2. Therefore, each MTJ 37 has a magnetic easy axis parallel to the long axis, i.e. parallel to the x-axis, and a magnetic hard axis parallel to the short axis, i.e. parallel to the y-axis.

Figure 3B:
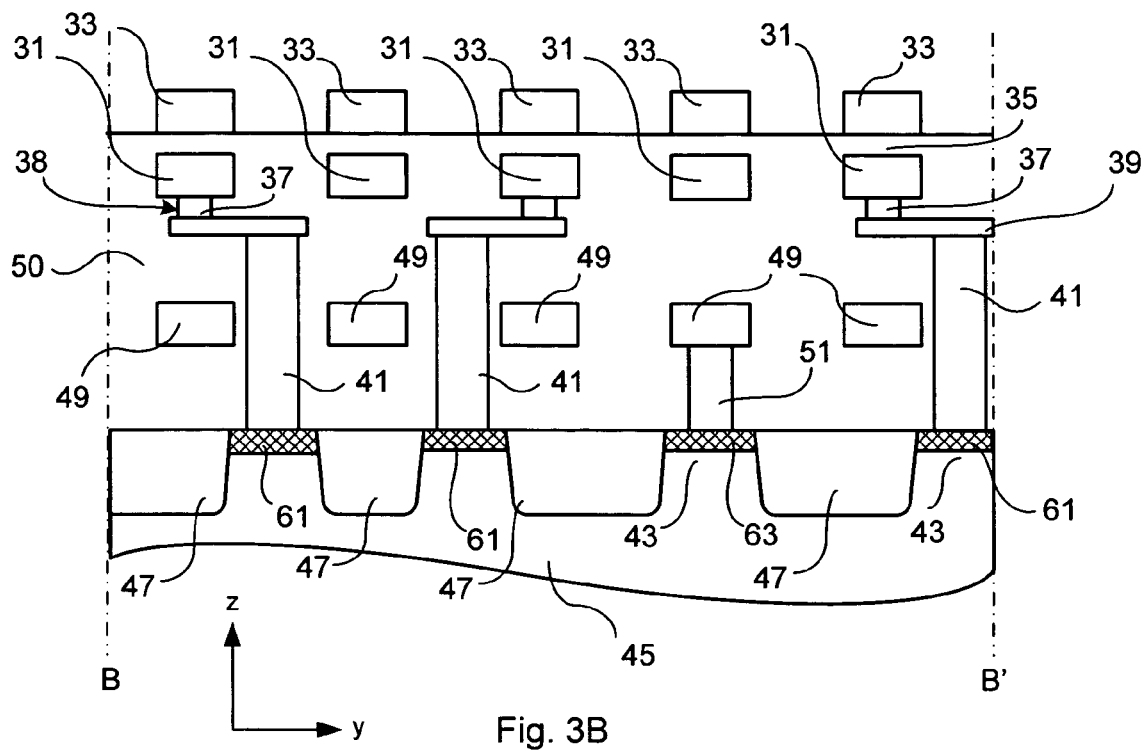
FIG. 3B is a cross section of the memory array shown in FIG. 3A taken along a line B-B'.

Referring in particular to FIG. 3B, an upper side of each MTJ 37 is connected to the underside of a bit line 31. The assist current line 33 is above the bit line 31. Thus, the MTJs 37 are electrically isolated from the assist current lines 33. An underside of each MTJ 37 is connected to a bottom electrode 39. A via 41 connects each bottom electrode 39 to an active region 43 in a substrate 45. The active regions 43 define areas within which diffusion of charge carriers can occur in the substrate 45.

The active regions 43 are isolated from one another in the substrate 45 by shallow trench isolation (STI) regions 47.

Figure 3C:
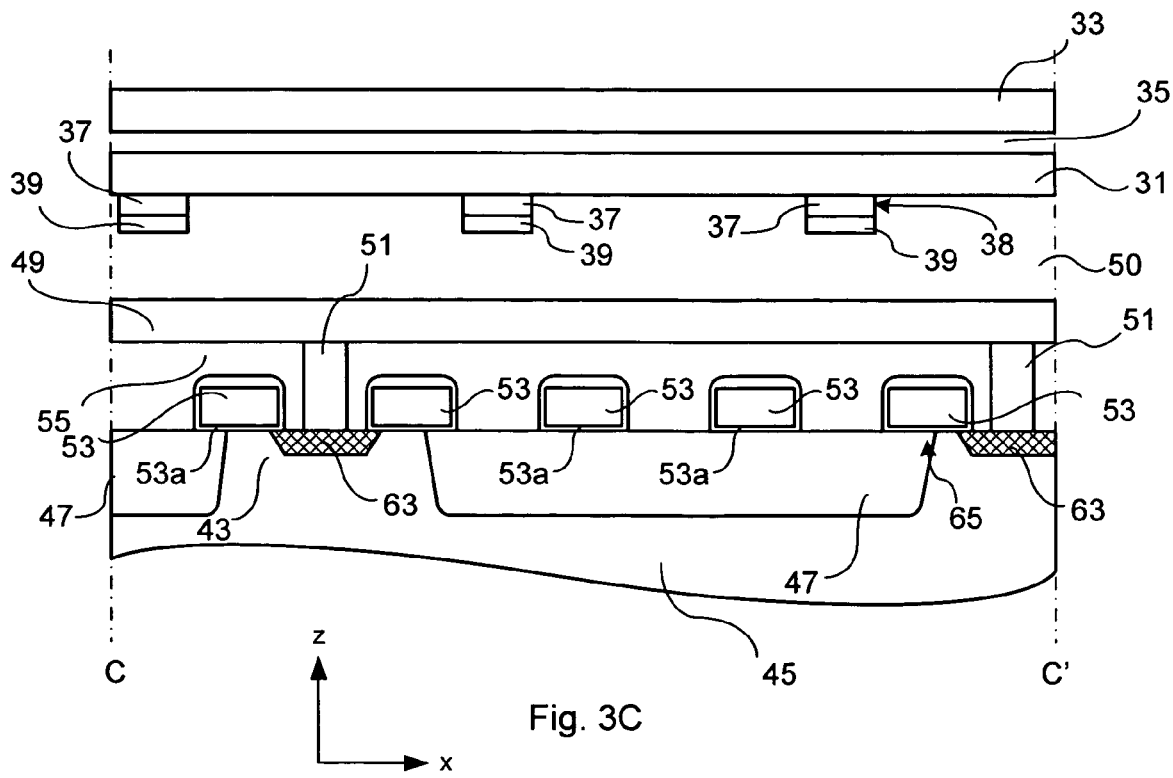
FIG. 3C is a cross section of the memory array shown in FIG. 3A taken along a line C-C'.

Referring in particular to FIG. 3C, a sense line 49 runs parallel to and underneath each bit line 31. The sense lines 49 are separated from the bit lines 31, the bottom electrodes 39, and vias 41 by an insulating matrix 50. A via 51 connects each active region 43 to the sense line 49 above it.

The word lines 53 are provided on the substrate 45 and are isolated therefrom by a gate oxide 53a. The word lines 53 are arranged perpendicular to the bit lines 31, the assist current lines 33, and the sense lines 49. The word lines 53 are separated from the sense lines 49 by an insulating matrix 55.

Referring in particular to FIG. 3A, on each row of the array, MTJs 37 are provided alternately between neighbouring pairs of the word lines 53. For example, for a first bit line $31_1$, a first MTJ $37_1$ is provided between a first word line (not shown) and a second, adjacent word line $53_2$, a second MTJ $37_2$ is provided between third and fourth word lines $53_3$, $53_4$, and a third MTJ $37_3$ is provided between fifth and sixth word lines $53_5$, $53_6$. For a second bit line $31_2$ (adjacent to the first bit line $31_1$), a fourth MTJ $37_4$ is provided between second and third words lines $53_2$, $53_3$, a fifth MTJ $37_5$ is provided between fourth and fifth bit lines $53_4$, $53_5$ and a sixth MTJ $37_6$ is provided between a sixth word line $53_6$ and a seventh, adjacent word line (not shown). Neighbouring MTJs 37 on each bit line 31 are arranged into pairs 59.

Figure 3D:
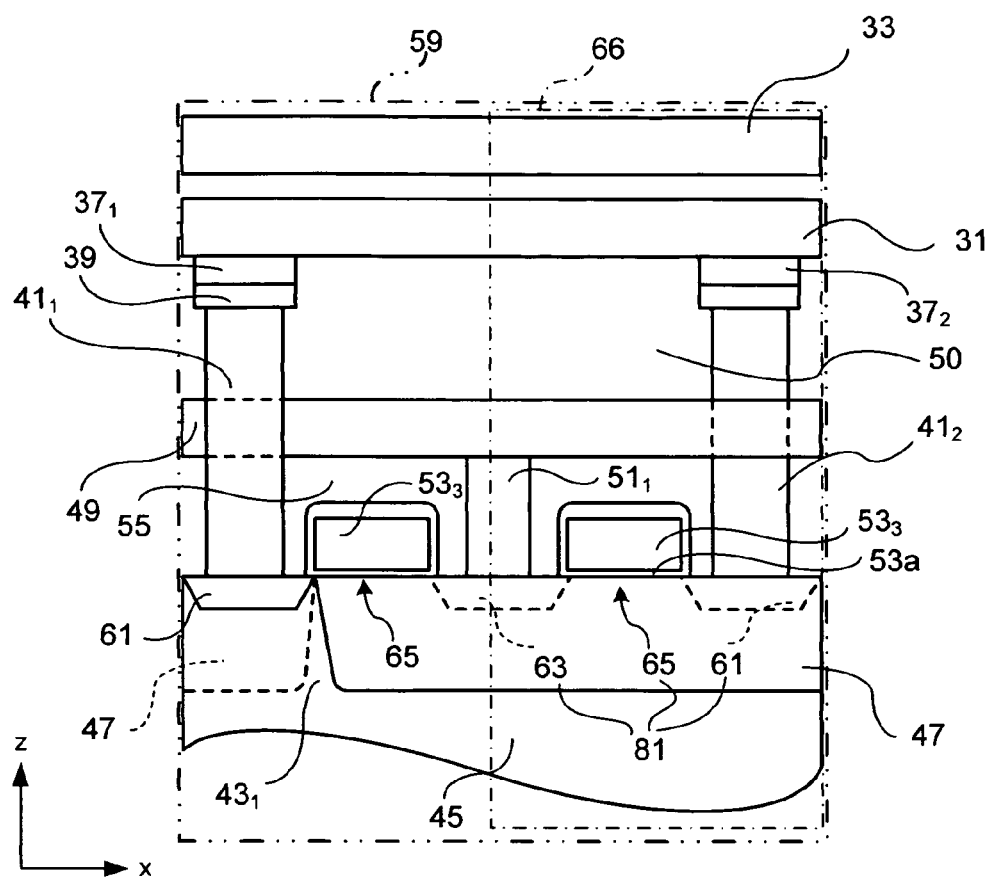
FIG. 3D is a side view of part of the memory array shown in FIG. 3A.

Referring in particular to FIG. 3D, each pair of MTJs 59 has an active region $43_1$ running between the respective vias $41_1$, $41_2$ of two MTJs 37a, 37b. STI regions 47 separate the active region $43_1$ for each pair 59. The via $51_1$ connecting the active region $43_1$ to the sense line 49 is provided between the word lines $53_2$, $53_3$ that are in area defined by the pair 59.

Referring still to FIG. 3D, a source region 61 is provided in the active region 43 below each via 41 connecting the bottom electrode 39 to the active region 43. A drain region 63 is provided in the active region 43 below each via 51 connecting the sense line 49 to the active region 43. Therefore, each active region 43 provides two source regions 61 and one drain region 63. Conduction between each source region 61 and the drain region 63 occurs through the word line 53 between said regions. Therefore, said word line 53 serves as a gate 65 of an isolation transistor 81, and one isolation transistor 81 is provided for each MTJ 37.

Referring to FIG. 3A and FIG. 3D, a memory cell 66 is defined by one MTJ 37 and a respective transistor. The drain region 63 of the transistor is shared between neighbouring memory cells 66. The memory cell 66 has an area 8 $F^2$. The feature size F of the memory array may be 100 nm or less.

The separation between the bit line 31 and the assist current line 33 is in the range 20 nm to 100 nm. The bit line 31 and the assist current line 33 are made of a conductive material, such as copper or tungsten. The insulating matrix 35 is silicon dioxide ($SiO_2$).

Figure 4:
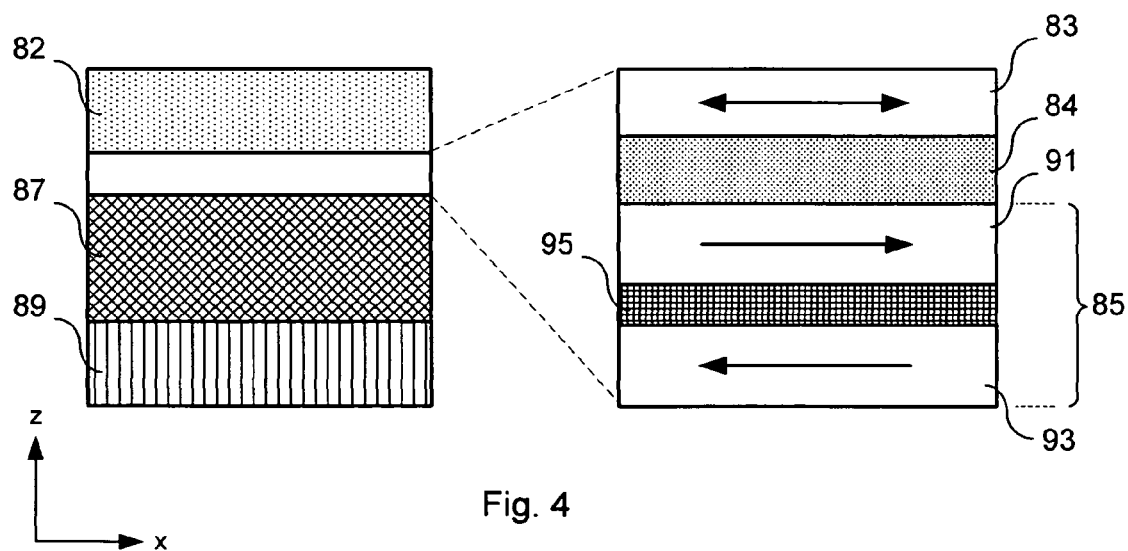
FIG. 4 is a cross section of a magnetic tunnel junction used in the memory array shown in FIG. 3A.

Referring to FIG. 4, the layer structure of the MTJ 37 is shown.

The MTJ 37 comprises a sequence of layers, including a capping layer 82, a free layer 83, a tunnel barrier layer 84, a pinned layer 85, a pinning layer 87, and a buffer layer 89. In this example, the capping layer 82 is furthest from the substrate 45 and the buffer layer 89 is closest to the substrate 45.

The free layer 83 is formed magnesium oxide (MgO) and is sufficiently thin that electrons can tunnel through it.

The pinned layer 85 is a synthetic antiferromagnet (SAF). The SAF 85 comprises a first ferromagnetic sub-layer 91, having a first magnetisation, and a second ferromagnetic sub-layer 93, having a second magnetisation, separated by an antiferromagnetic layer 95. The first magnetisation and the second magnetisation are unequal in magnitude, and are anti-parallel to one another. In this example, the second ferromagnetic sub-layer 93 is a thicker than the first ferromagnetic sub-layer 91, therefore the second magnetisation has a larger magnitude than the first magnetisation.

The antiferromagnetic layer 95 couples the first ferromagnetic sub-layer 91 and the second ferromagnetic sub-layer 93. The first magnetisation and the second magnetisation are aligned parallel to the easy axis of the MTJ 37 i.e. parallel to the x-axis. Therefore, the SAF has a small net magnetisation in the x-direction. The pinned layer 85 has a relatively high coercivity.

The pinning layer 87 comprises an antiferromagnetic material. The pinning layer 87 pins the magnetisation of the pinned layer 85, to prevent the magnetisation of the pinned layer 85 from switching on application of a magnetic field or a switching current.

When the magnetisation of the free layer 83 is parallel to the magnetisation of the first ferromagnetic sub-layer 91 of the pinned layer 85, the MTJ 37 has a relatively low magnetoresistance. When the magnetisation of the free layer 83 is anti-parallel to the magnetisation of the first ferromagnetic sub-layer 91 of the pinned layer 85, the MTJ 37 has a relatively high magnetoresistance.

In this example, the capping layer 82 is formed of a non-magnetic metal, for example copper (Cu) or tantalum (Ta), and has a thickness of about 10 nm. In another example, the capping layer 82 may be formed of two layers of tantalum each having a thickness of 5 nm separated by a layer of copper having a thickness of 10 nm i.e. Ta (5 nm)/Cu (10 nm)/Ta (5 nm).

In this example, the free layer 83 is formed of cobalt iron boron (CoFeB) and has a thickness of about 3 nm.

In this example, the tunnel barrier layer 84 is formed of magnesium oxide (MgO). However, other dielectric materials, such as aluminium oxide ($AlO_x$), silicon dioxide ($SiO_2$), and aluminium nitride (AlN), can be used. In this example, the tunnel barrier layer 84 has a thickness of 2 nm. In other examples, the thickness of the tunnel barrier layer 84 can be in the range 1 nm to 2 nm.

The first ferromagnetic sub-layer 91 is formed of cobalt iron boron (CoFeB) and has a thickness of about 4 nm. The coupling layer 95 is formed of rubidium (Ru) and has a thickness of about 0.8 nm. The second ferromagnetic sub-layer 93 is formed of cobalt iron (CoFe) and has a thickness of about 6 nm.

In this example, the pinning layer comprises platinum manganese (PtMn) and has a thickness of about 15 nm. PtMn is preferred because it has a high blocking temperature and a high exchange biasing field, which improve the thermal stability of the MTJ 37. However, other antiferromagnetic materials such as iridium manganese (IrMn), nickel manganese (NiMn) and palladium manganese (PdMn) can be used.

The buffer layer 89 is formed of at least one non-magnetic conductive layer and has a thickness between 10 nm and 20 nm. For example, the buffer layer 89 can be formed of two layers of tantalum each having a thickness of 5 nm separated by a layer of copper having a thickness of 10 nm, and an overlying layer of nickel-iron having a thickness of 5 nm separated from the copper layer by one of the tantalum layers i.e. Ta (5 nm)/Cu (10 nm)/Ta (5 nm)/NiFe(5 nm). Alternatively, the two tantalum layers may be separated by a gold layer having a thickness of 10 nm i.e. Ta (5 nm)/Au (10 nm)/Ta (5 nm)/NiFe(5 nm). In another example, the buffer layer 89 may be formed of a layer of tantalum having a thickness of 5 nm and a layer of nickel-iron having a thickness of 5 nm i.e. Ta (5 nm)/NiFe(5 nm). In the above examples, the nickel-iron layer is a seed layer for the pinning layer 87.

The long and short axes of the elliptical cross section of the MTJ 37 in the x-y plane have dimensions 100 nm and 50 nm respectively.

The ratio of magnetoresistance for the relatively high resistance state and the relatively low resistance state can approach 3:1 for the above-described MTJ 37. This can provide an MRAM having a high signal to noise ratio.

The assist current line 33 and the free layer 83 are separated by a distance dependent upon the anisotropy magnetic field of the free layer 83, and the current through the assist current line 33. The anisotropy magnetic field can be determined by measuring the hysteresis loop of the free layer 83 when a magnetic field is applied to the magnetic hard axis of the free layer 83. The magnitude of the assist magnetic field may be one tenth of the anisotropy magnetic field. In this example, the anisotropy magnetic field of the free layer 83 is typically 300 to 400 Oe. Therefore, the assist magnetic field is 30 to 40 Oe. The magnitude of the assist magnetic field in the free layer 83 is related to the current in the assist current line 33 by:

$$H_A = \frac{I_A}{2\pi r} \quad (2)$$

where $H_A$ is the assist magnetic field, $I_A$ is the current in the assist current line 33 and r is the distance between the assist current line 33 and the free layer 83. Typically, the maximum current density that can be provided by a copper wire is of the order of $10^6$ A/cm$^2$. Thus, for a wire of thickness 50 nm, $I_A$ is of the order of $10^{-10}$ A. Using equation (2) above, the distance between the assist current line 33 and the MTJ 37 is of the order of 100 nm.

Figure 5:
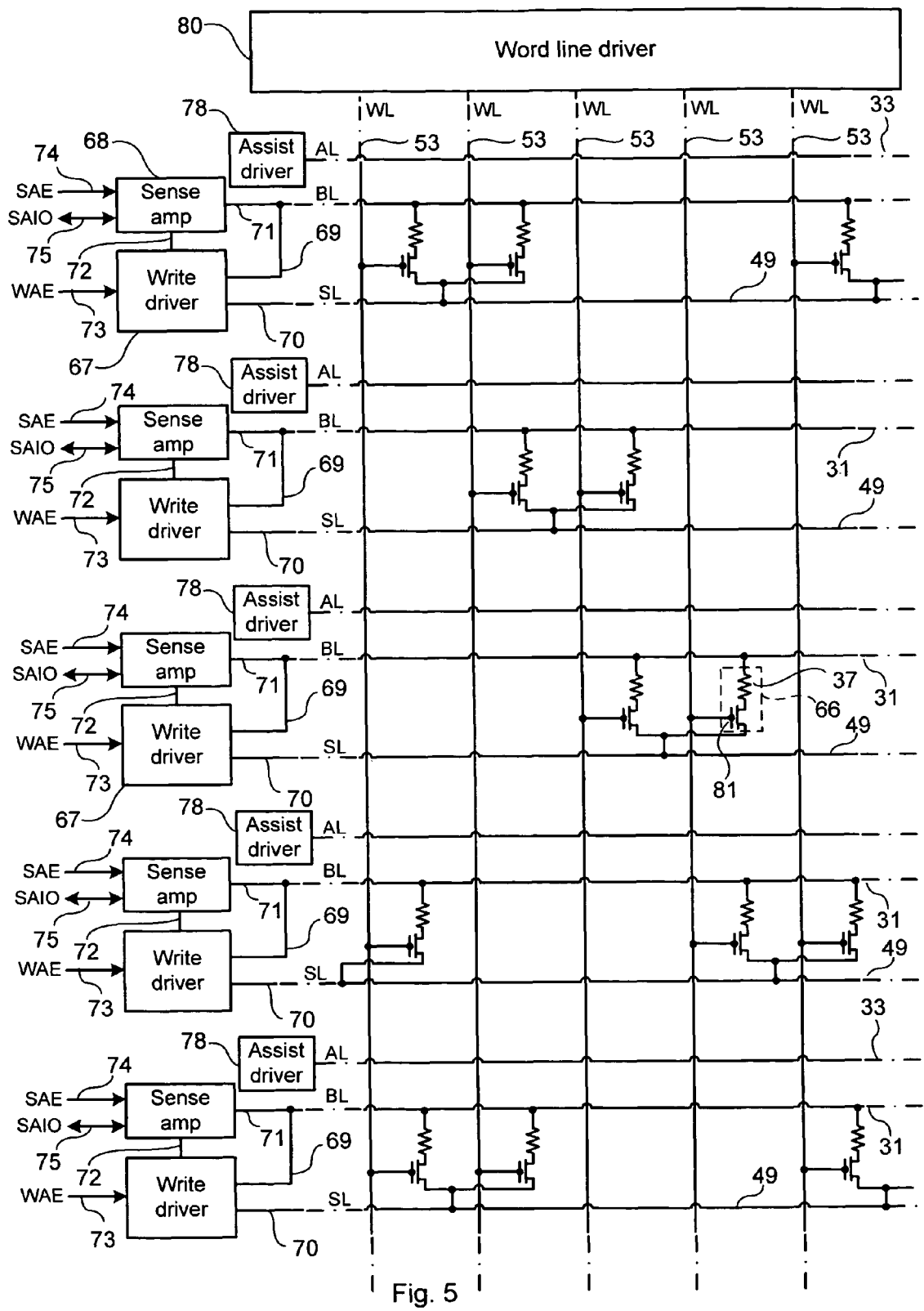
FIG. 5 illustrates control circuitry for the memory array shown in FIG. 3A.

Referring to FIG. 5, control circuitry for the memory array is shown.

A write driver 67 and a sense amplifier 68 are provided for each row of the memory array. Each bit line 31 is connected to a first output 69 of a respective write driver 67. Each sense line 49 is connected to a second output 70 of the respective write driver 67. Each bit line 31 is also connected to a first input/output port 71 of the respective sense amplifier 68.

A connection 72 is provided between a second output of the sense amplifier 68 and a first input of the respective write driver 67.

The write driver 67 has a second input 73 for applying a write amplifier enable (WAE) voltage.

The sense amplifier 68 has a second input 74 for receiving a sense amplifier enable (SAE) voltage. The sense amplifier 68 has a third input/output port 75 for applying a sense amplifier input/output (SAIO) voltage.

An assist driver 78 is provided for each row of the array. Each assist driver 78 has a first input connected to an assist current line 33.

A single word line driver 80 is provided. Each word line 53 is connected to a respective output of word line driver 80.

Each MTJ 37 connects a bit line 31 to the sense line 49 in the same row, through a single isolation transistor 81. The base of the isolation transistor 81 is connected to a single word line 53. Current will flow through the MTJ 37 when a bias is applied to the word line 53 defining the column of the MTJ 37, and a bias is applied to the bit line 31 or sense line 49 defining the row of the MTJ 37. In this way, each MTJ 37 is addressable by a single word line 53 and a single bit line 31 or sense line 49.

Device Operation

Figure 6:
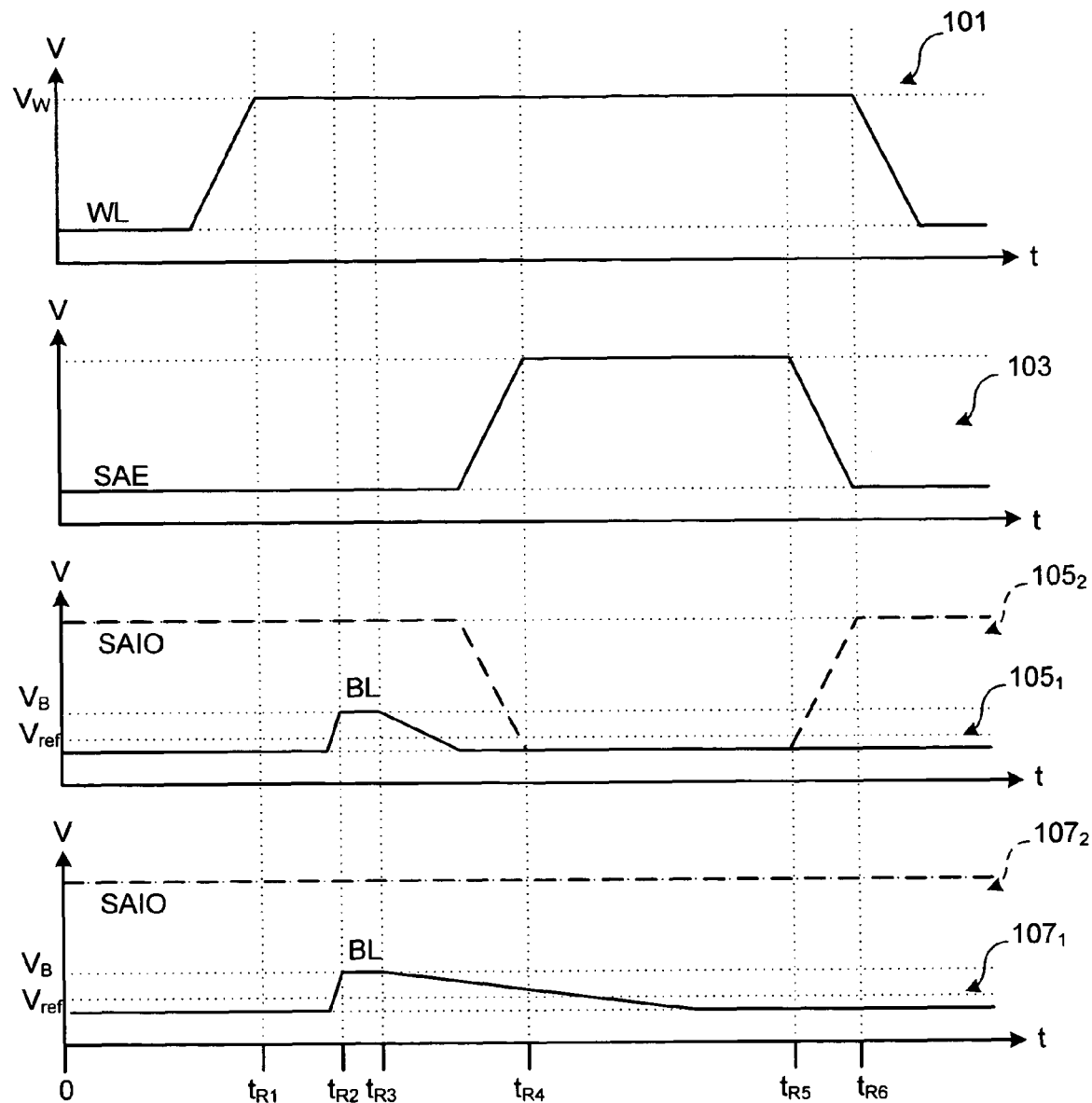
FIG. 6 illustrates biases which are applied to the memory array shown in FIG. 3A during a read cycle.

Referring to FIGS. 4, 5 and 6, reading and writing of a memory cell 66 in the memory array will now be described.

FIG. 6 illustrates biases which are applied to and measured in the memory array during a read cycle.

A first plot 101 is of a word line bias against time. A second plot 103 is of a sense amplifier enable (SAE) bias applied to the second input 74 of the sense amplifier 68 against time. A third plot 105$_1$ and a fourth plot 105$_2$ are of the voltage response on the bit line 31 against time and the sense amplifier input/output (SAIO) bias against time respectively, when the magnetisation of the free layer 83 and the magnetisation of the pinned layer 85 are parallel. A fifth plot 107$_1$ and a sixth plot 107$_2$ are of the voltage response on the bit line 31 against time and the SAIO bias against time respectively, when the magnetisation of the free layer 83 and the magnetisation of the pinned layer 85 are antiparallel.

As shown in the first plot 101, at a time $t_{R1}$ a bias $V_W$ is applied by the word line driver 80 to the word line (WL) 53 corresponding to the column of the memory cell 66. $V_W$ may be in the range 1 V to 3 V. This opens the isolation transistors 81 in the column of the array.

As shown in the third plot 105$_1$ and the fifth plot 107$_1$, at a time $t_{R2}$ a bias $V_B$ is applied by the write driver 67 to the bit line (BL) 31 corresponding to the row of the memory cell. In this example, $V_B$ is about 0.4 V. The sense line (SL) 49 corresponding to the row of the memory cell is held a ground. At time $t_{R3}$, the bias $V_B$ is removed.

As shown in the third plot 105₁, in this example the voltage response on the bit line 31 decreases to ground in about 1 ns. This is because, when the magnetisation of the free layer 83 and the magnetisation of the pinned layer 85 are parallel, the magnetoresistance of the MTJ 37 (and thus the measured voltage response) is relatively low, thus the voltage response is relatively fast.

As shown in the fifth plot 107₁, in this example the voltage response on the bit line 31 decreases to ground in about 2 to 3 ns. This is because, when the magnetisation of the free layer 83 and the magnetisation of the pinned layer 85 are anti-parallel, the magnetoresistance of the MTJ 37 (and thus the measured voltage response) is relatively high, thus the voltage response is relatively slow.

As shown in the second plot 103, at a later time $t_{R4}$, the SAE bias is applied the sense amplifier 68 that corresponds to the row of the memory cell 66. When the sense amplifier 68 is enabled, it senses whether the voltage response on the bit line 31 is below a reference voltage $V_{ref}$. $V_{ref}$ may be about $0.5 V_B$. In this example, $V_{ref}$ is 0.2V.

As shown in the third plot 105₁, when the magnetisation of the free layer 83 and the magnetisation of the pinned layer 85 are parallel, by time $t_{R4}$ the voltage response on the bit line 31 has dropped below $V_{ref}$. This is sensed by the sense amplifier 68. Therefore, the sense amplifier input/output (SAIO) at the third input/output port 75 of the sense amplifier 68 is set to be low.

As shown in the fifth plot 107₂, when the free layer 83 and the pinned layer 85 are antiparallel, by time $t_{R4}$ the voltage response on the bit line 31 has not dropped below $V_{ref}$. This is sensed by the sense amplifier 68. Therefore, the SAIO at the third input/output port 75 of the sense amplifier 68 is set to be high.

At time $t_{R5}$, the SAE bias is removed. At time $t_{R6}$, the WL bias is removed. In this example, $t_{R1}$ is 1 ns, $t_{R2}$ is 2.5 ns, $t_{R3}$ is 3.5 ns, $t_{R4}$ is 7.5 ns, $t_{R5}$ is 9 ns, and $t_{R6}$ is 10 ns.

In this way, the direction of magnetisation of the free layer 83 determines the output of the third input/output port 75 of the sense amplifier 68. If the free layer 83 is parallel to the pinned layer 85, the output of the sense amplifier 68 is '0'. If the free layer 83 is anti-parallel to the pinned layer 85, the output of the sense amplifier 68 is '1'.

Figure 7:
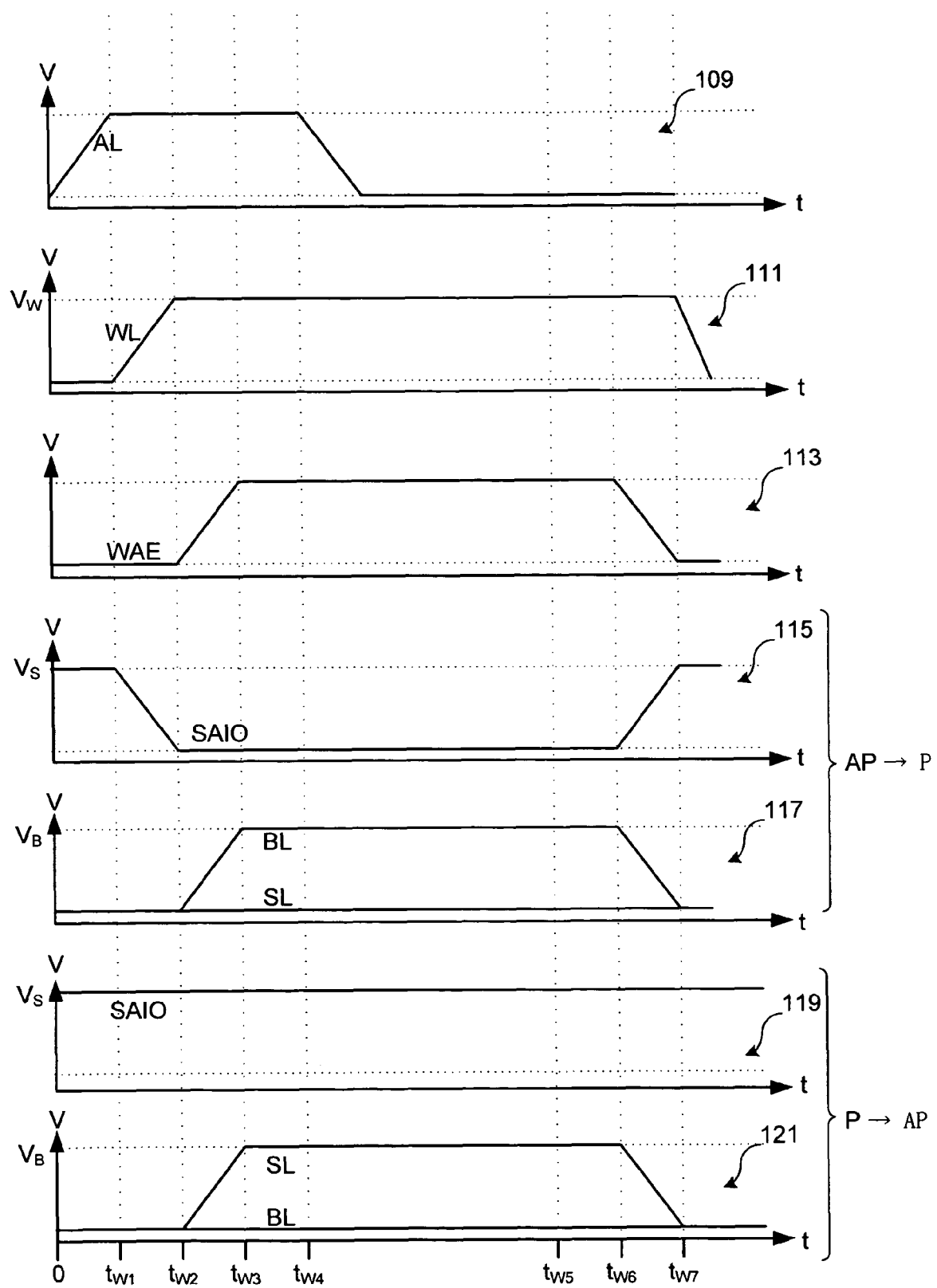
FIG. 7 illustrates biases which are applied to the memory array shown in FIG. 3A during a write cycle.

FIG. 7 illustrates biases which are applied to the memory array during a write cycle.

A seventh plot 109 is of an assist current line (AL) bias against time. An eighth plot 111 is of a word line (WL) bias against time. A ninth plot 113 is of a write amplifier enable (WAE) bias against time. A tenth plot 115 and an eleventh plot 117 are of an SAIO bias applied to the memory cell 66 against time and of biases applied to the bit line (BL) and sense line (SL) against time respectively, when the magnetisation of the free layer 83 switches from anti-parallel to the magnetisation of the pinned layer 85 to parallel to the magnetisation of the pinned layer 85 (AP to P switching). A twelfth plot 119 and a thirteenth plot 121 are of an SAIO bias applied to the memory cell 66 against time and of biases applied to the bit line (BL) and sense line (SL) against time respectively, when the magnetisation of the free layer 83 switches from parallel to the magnetisation of the pinned layer 85 to anti-parallel to the magnetisation of the pinned layer 85 (P to AP switching).

Referring to the seventh plot 109, to write data to the memory cell 66, at time $t_{W1}$ the AL 33 bias $V_A$ is applied by the assist driver 78 to the assist current line 33 that corresponds to the row of the memory cell 66. The magnitude of $V_A$ is chosen to provide the required assist magnetic field in the free layer 83. A value of $V_A$ can be found by routine experiment.

Referring to the eighth plot 111, at time $t_{W2}$ the WL bias $V_W$ is applied by the word line driver 80 to the word line 53 that corresponds to the column of the memory cell 66. $V_W$ may be in the range 1V to 3V. This opens the isolation transistors 81 in the column of the array.

At time $t_{W2}$, the SAIO bias is applied to the third input/output port 75 of the sense amplifier 68 corresponding to the row of the memory cell 66. As shown in the tenth plot 115, for AP to P switching the SAIO bias is held at ground. As shown in the twelfth plot 119, for P to AP switching the SAIO bias is held at $V_S$. The connection 72 transmits this signal from the second output of the sense amplifier 68 to the first input of the write driver 67.

Referring to the ninth plot 113, at time $t_{W3}$ the WAE bias is applied to the write driver 67 corresponding to the row of the memory cell 66. This enables the write driver 67 to apply a bias to either the bit line 31 or the sense line 49, depending on the output SAIO of the sense amplifier 68.

Referring to the eleventh plot 117, when SAIO is held at ground, at time $t_{W3}$ the write driver 67 applies a bias $V_B$ to the bit line 31, and the sense line 49 is held at ground. Therefore, the write driver 67 drives current from the sense line 49 to the bit line 31. This causes the free layer 83 to switch from AP to P.

Referring to the thirteenth plot 121, when SAIO is held at $V_S$, at time $t_{W3}$ the write driver 67 applies a bias $V_B$ to the sense line 49, and the bit line 31 is held at ground. Therefore, the write driver 67 drives current from the bit line 31 to the sense line 49. This causes the free layer 83 to switch from P to AP.

$V_B$ may be in the range 1 V to 1.5 V, and has approximately the same value for P to AP switching as for AP to P switching.

At time $t_{W4}$, the AL bias is removed. At time $t_{W6}$, the BL or SL bias is removed. At time $t_{W7}$, the WL bias is removed.

In this example, $t_{W1}$ is 1 ns, $t_{W2}$ is 2 ns, $t_{W3}$ is 3 ns, $t_{W4}$ is 4 ns, $t_{W5}$ is 8 ns, $t_{W6}$ is 9 ns, and $t_{W7}$ is 10 ns.

Figure 8A:
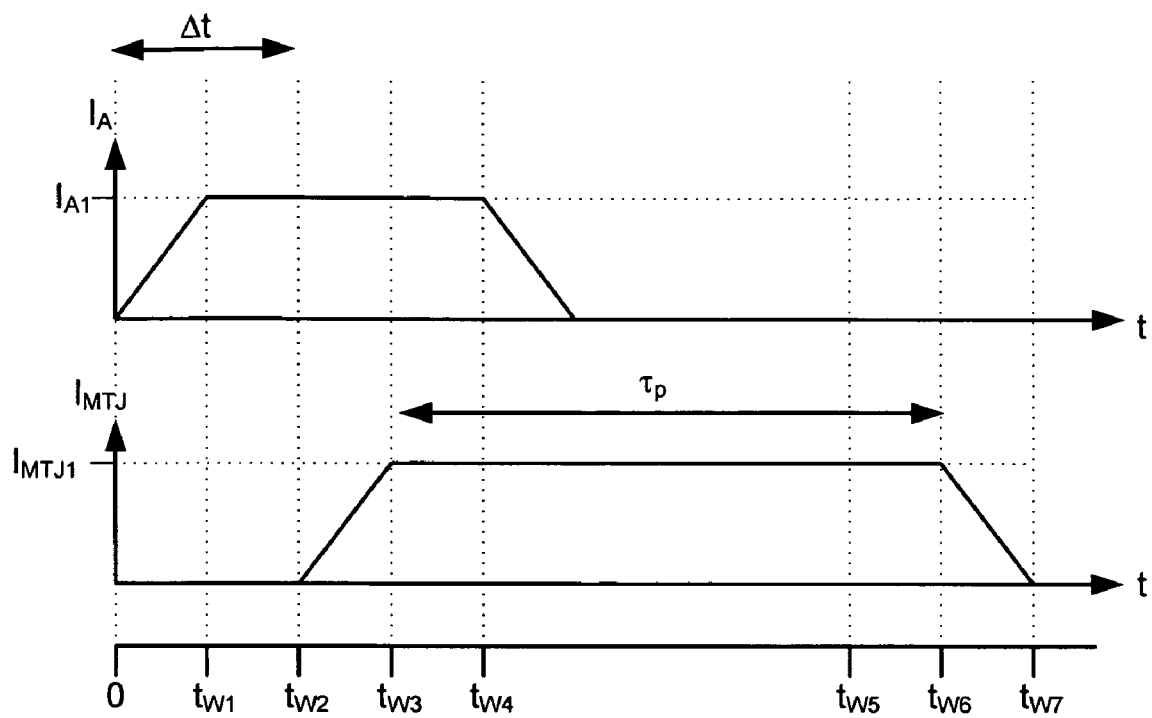
FIGS. 8A and 8B illustrates current through the memory array shown in FIG. 3A during a write cycle.
Figure 8B:
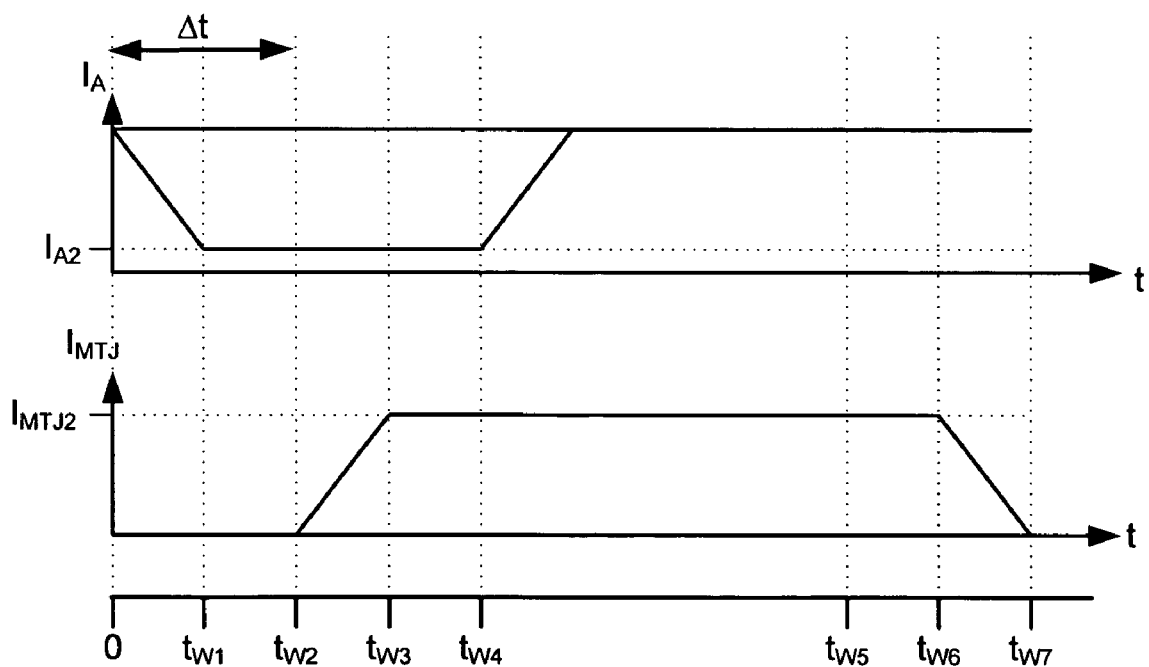
Figure 9A:
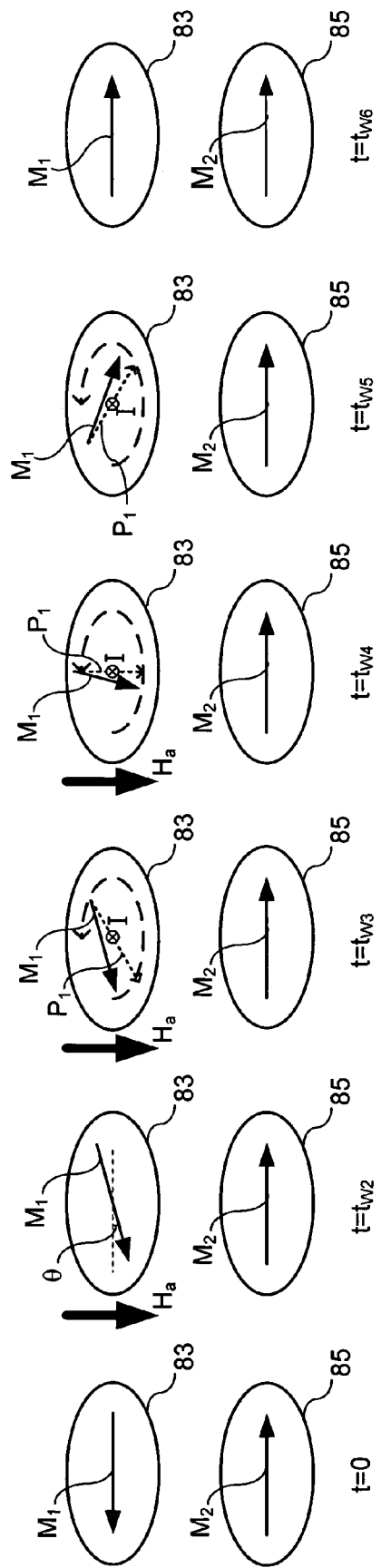
FIGS. 9A and 9B are schematic illustrations of magnetisations of a free layer and a pinned layer in the memory array shown in FIG. 3A, at various times of the write cycle.
Figure 9B:
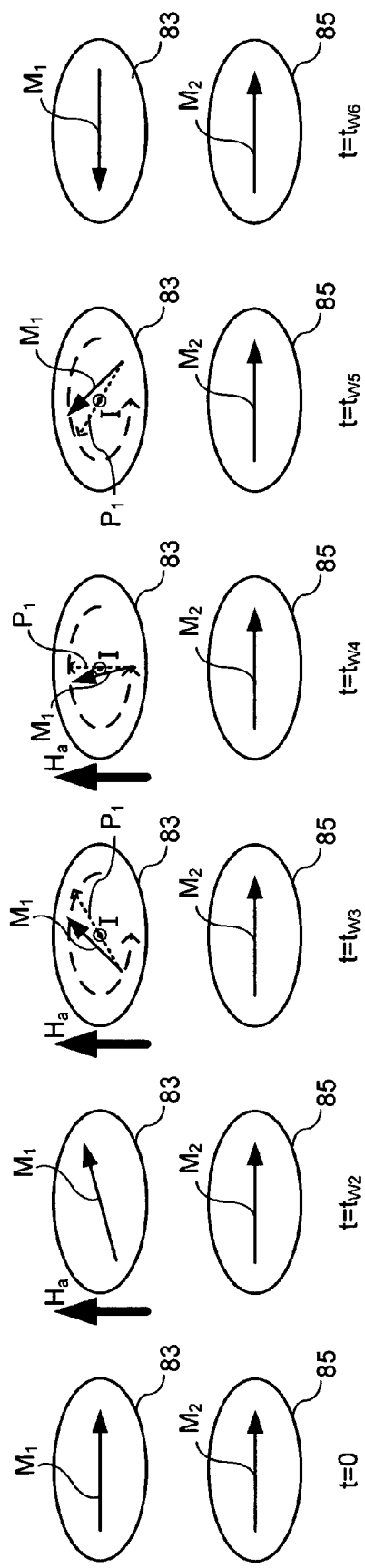

FIGS. 8A and 8B illustrate the current $I_A$ through the assist current line 33 (FIG. 4) and the current $I_{MTJ}$ through the MTJ 37 (FIG. 4) at times of the write cycle for AP to P switching and P to AP switching respectively. FIGS. 9A and 9B illustrate magnetisations $M_1$, $M_2$ of the free layer 83 at times of the write cycle for AP to P switching and P to AP switching respectively.

Referring firstly to FIG. 8A and FIG. 9A, at time t=0, the magnetisation $M_1$ of the free layer 83 and the magnetisation $M_2$ of the pinned layer 85 are anti-parallel, and $I_A$ and $I_{MTJ}$ are zero.

Between time $t_{W1}$ and $t_{W2}$, the current $I_A$ in the assist current line 33 is ramped up (or rises) to a magnitude $I_{A1}$. $I_{A1}$ may be of the order of 100 µA. The current $I_A$ in the assist current line 33 is held at $I_{A1}$ between time $t_{W2}$ and $t_{W4}$.

At time $t_{W1}$, the current $I_A$ induces an assist magnetic field $H_A$ in the free layer 83. The magnetic field $H_A$ is parallel to the magnetic hard axis of the free layer 83. By time $t_{W2}$, application of the field $H_A$ causes the magnetisation $M_1$ of the free layer 83 to rotate anticlockwise by an angle θ in the plane of the free layer 83.

Between time $t_{W2}$ and $t_{W3}$, the current $I_{MTJ}$ in the MTJ 37 is ramped up to a magnitude $I_{MTJ1}$. The current $I_{MTJ}$ in the MTJ 37 is held at $I_{MTJ1}$ between time $t_{W3}$ and $t_{W6}$.

At time $t_{W3}$, the current $I_{MTJ}$ flows from the free layer 83 to the pinned layer 85. Therefore, electrons that are spin-polarised by the pinned layer 85 are injected into the free layer 83. The spin transferred by these electrons causes precession of the magnetisation $M_1$ of the free layer 83 about a precession axis $P_1$. Therefore, the magnetisation $M_1$ rotates around the precession axis $P_1$. The precession axis $P_1$, and therefore the time average of the magnetisation $M_1$, is rotated further anticlockwise in the plane of the free layer 83. This rotation is assisted by the magnetic field $H_A$.

At time $t_{W4}$, the magnetisation $M_1$ of the free layer 83 continues to rotate around the precession axis $P_1$. The precession axis $P_1$ of the magnetisation $M_1$ is perpendicular to the initial direction of the magnetisation $M_1$ i.e. it is parallel to the magnetic hard axis of the free layer 83 and to the assist magnetic field $H_A$. Between times $t_{W4}$ and $t_{W5}$, the angle of the magnetisation $M_1$ around the precession axis $P_1$ gradually increases, and the precession axis $P_1$ suddenly rotates further anticlockwise.

At time $t_{W4}$, the current $I_{MTJ}$ still causes the precession axis $P_1$ to rotate clockwise. Therefore, it is preferable that the assist current $I_A$ is removed so that it does not act to prevent the precession axis $P_1$ rotating further anticlockwise. Between time $t_{W4}$ and $t_{W5}$, the current $I_A$ in the assist current line 33 is ramped down to zero.

At time $t_{W5}$, the assist current $I_A$ is zero, therefore there is no assist magnetic field $H_A$. The switching current $I_{MTJ}$ remains, causing the precession axis $P_1$ of the magnetisation $M_1$ of the free layer 83 to rotate further anticlockwise.

At time $t_{W6}$, there is no longer precession of the magnetisation $M_1$. The magnetisation $M_1$ of the free layer 83 is parallel to the magnetisation $M_2$ of the pinned layer 85.

Between time $t_{W6}$ and $t_{W7}$, the current $I_{MTJ}$ is ramped down (or falls) to zero.

Referring now to FIG. 8B and FIG. 9B, at time t=0, the magnetisation $M_1$ of the free layer 83 and the magnetisation $M_2$ of the pinned layer 85 are parallel, and $I_A$ and $I_{MTJ}$ are zero.

Between time $t_{W1}$ and $t_{W2}$, the current $I_A$ in the assist current line 33 is ramped up to a magnitude $I_{A2}$. The current $I_{A2}$ has the same magnitude as $I_{A1}$, but is in the opposite direction. The current $I_A$ in the assist current line 33 is held at $I_{A2}$ between time $t_{W2}$ and $t_{W4}$.

At time $t_{W1}$, the current $I_A$ induces an assist magnetic field $H_A$ in the free layer 83. The magnetic field $H_A$ is parallel to the magnetic hard axis of the free layer 83. By time $t_{W2}$, application of the field $H_A$ causes the magnetisation $M_1$ of the free layer 83 to rotate anticlockwise by an angle $\theta$ in the plane of the free layer 83.

Between time $t_{W2}$ and $t_{W3}$, the current $I_{MTJ}$ in the MTJ 37 is ramped up to a magnitude $I_{MTJ2}$. The current $I_{MTJ}$ in the MTJ 37 is held at $I_{MTJ2}$ between time $t_{W3}$ and $t_{W6}$. $I_{MTJ2}$ has approximately the same magnitude as $I_{MTJ1}$.

At time $t_{W3}$, the current $I_{MTJ}$ flows from the pinned layer 85 to the free layer 83. Therefore, spin-polarised electrons are scattered from the pinned layer 85 and injected into the free layer 83. The spin transferred by these electrons causes precession of the magnetisation $M_1$ of the free layer 83. Therefore, the magnetisation $M_1$ rotates around the precession axis. The precession axis $P_1$, and therefore the time average of the magnetisation $M_1$, is rotated further anticlockwise in the plane of the free layer 83. This rotation is assisted by the magnetic field $H_A$.

At time $t_{W4}$, the magnetisation $M_1$ of the free layer 83 continues to rotate around the precession axis $P_1$. The precession axis $P_1$ of the magnetisation $M_1$ is perpendicular to the initial direction of the magnetisation $M_1$ i.e. it is parallel to the magnetic hard axis of the free layer 83 and to the assist magnetic field $H_A$. Between times $t_{W4}$ and $t_{W5}$, the angle of the magnetisation $M_1$ around the precession axis $P_1$ gradually increases, and the precession axis $P_1$ suddenly rotates further anticlockwise.

At time $t_{W4}$, the current $I_{MTJ}$ still causes the precession axis $P_1$ to rotate anticlockwise. Therefore, it is preferable that the assist current $I_A$ is removed so that it does not act to prevent the precession axis $P_1$ rotating further anticlockwise. Between time $t_{W4}$ and $t_{W5}$, the current $I_A$ in the assist current line 33 is ramped down to zero.

At time $t_{W5}$, the assist current $I_A$ is zero, therefore there is no assist magnetic field $H_A$. The switching current $I_{MTJ}$ remains, causing the precession axis $P_1$ of the free layer 83 to rotate further clockwise.

At time $t_{W6}$, there is no longer precession of the magnetisation $M_1$. The magnetisation $M_1$ of the free layer 83 is anti-parallel to the magnetisation $M_2$ of the pinned layer 85.

Between time $t_{W6}$ and $t_{W7}$, the current $I_{MTJ}$ is ramped down to zero.

The current required to cause STT switching is related to the duration of the current pulse, as described above, and to the initial direction of the magnetisation of the free layer 83. The constant C in equation (1) above can be expanded, giving the following expression for the current required to cause STT switching, $I_{STT}$, in the free layer 83:

$$\frac{I_{STT}}{I_{c0}} - 1 = C' \ln(\pi/2\theta_0) \cdot t_p^{-1} \qquad (3)$$

where $I_{c0}$ is the DC threshold current, C' is a constant, $t_p$ is the switching time and $\theta_0$ initial angle between the magnetisation of the free layer 83 and the magnetic easy axis of the free layer 83. Therefore, according to equation (3) above, the larger the initial magnetisation angle $\theta_0$ the smaller the current required to cause STT switching. Therefore, the assist current $I_A$ can be applied before the STT switching current $I_{MTJ}$, to rotate the magnetisation of the free layer and thus lower the STT switching current. In other words, in this example the leading or rising edge of the assist current line bias occurs before the leading or rising edge of the bit line or sense line bias and the trailing or falling edge of the assist current line bias occurs after the leading or rising edge of the bit line bias or sense line bias.

However, it is preferable that the assist current $I_A$ is switched off during the STT switching process. This is because if the assist magnetic field $H_A$ is present after STT switching ends, the domain structure of the free layer 83 becomes unstable.

This causes an increase in the probability distribution of the STT switching current in the nanosecond regime, and a narrow current margin for the STT writing process. Therefore, in this example the trailing or falling edge of the assist current line bias occurs before the trailing or falling edge of the bit line or sense line bias.

As illustrated by the above examples, the direction of the assist magnetic field $H_A$ can be aligned in either of two directions parallel to the magnetic hard axis of the free layer 83 depending on the direction of the switching current $I_{MTJ}$. The switching current $I_{MTJ}$ induces an Ampere field in the free layer 83 and aligning the assist magnetic field $H_A$ to eliminate the Ampere field in the free layer 83 can result in a more favourable (e.g. more stable) domain structure in the free layer 83 for STT switching. Therefore, the assist magnetic field $H_A$ for AP to P switching can be arranged to be in the opposite direction to the assist magnetic field $H_A$ for P to AP switching. However, the effect of the Ampere field is not significant, and so the assist magnetic field $H_A$ can be aligned in the opposite direction, i.e. without counteracting the Ampere field, for STT switching.

As will be explained in more detail later, if the time interval $\Delta t$ between turning on the assist current $I_A$ and turning on the switching current $I_{MTJ}$ is sufficiently short (e.g. $\Delta t \leqq 5$ ns), then the switching current can be reduced further.

Figure 10A:
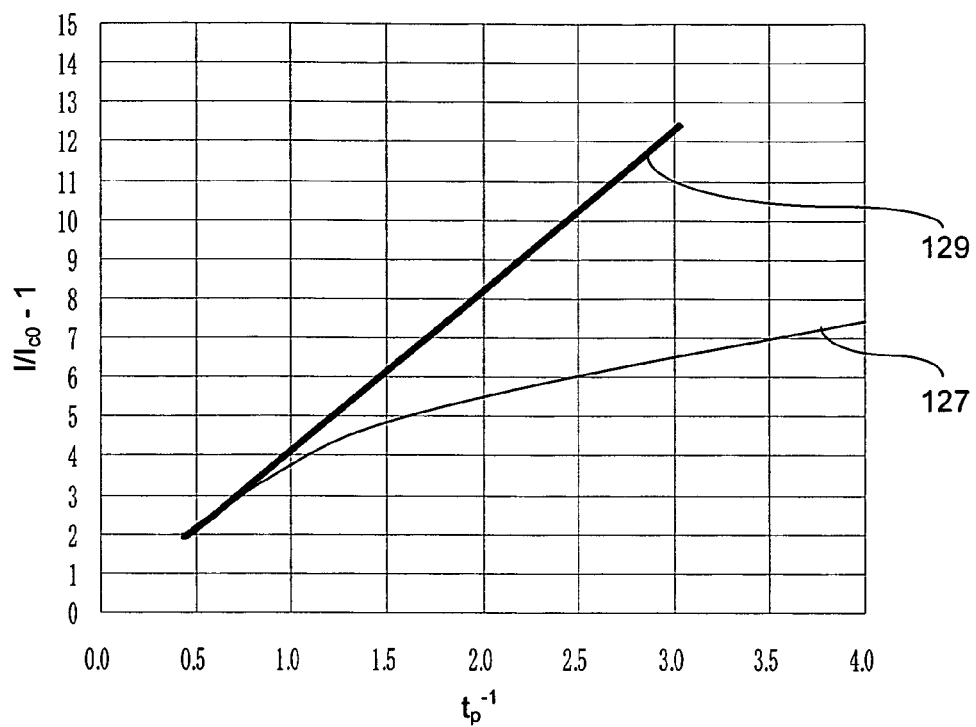
FIGS. 10A and 10B are plots of STT switching current against pulse duration.
Figure 10B:
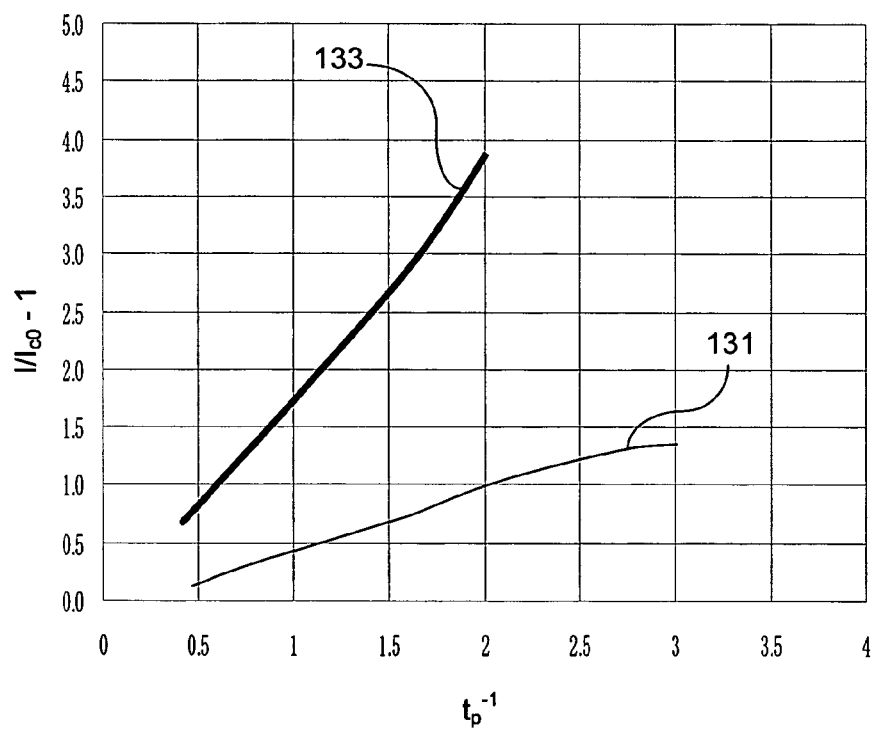

Referring to FIGS. 10A and 10B, respective simulation results for STT switching with and without an assist magnetic field are shown. The simulation is of STT switching at a temperature of 300 K, using a spin-polarised current having a polarisation of 0.5. The simulation results show normalised current $I/I_{c0}-1$ required for STT switching against the inverse of the pulse duration $t_p^{-1}$.

Referring in particular to FIG. 10A, for AP to P switching a switching current 127 for a given pulse duration when an assist magnetic field pulse of magnitude 80 Oe is used can be up to 50% less than a switching current 129 when no assist magnetic field is used.

Referring in particular to FIG. 10B, for P to AP switching a switching current 131 for a given pulse duration when an assist magnetic field pulse of magnitude 80 Oe is used can be up to 100% less than a switching current 133 when no assist magnetic field is used.

Device Fabrication

Referring to FIGS. 10A to 10G, a method of fabricating the memory array shown in FIGS. 3A to 3D will be described. FIGS. 11A, 11C, 11E and 11G show a cross section of the memory array shown in FIG. 3A taken along line B-B' during stages of the fabrication process. FIGS. 11B, 11D, 11F and 11H show a cross section of the FIG. 3A memory array taken along line C-C' during stages of the fabrication process.

Figure 11A:
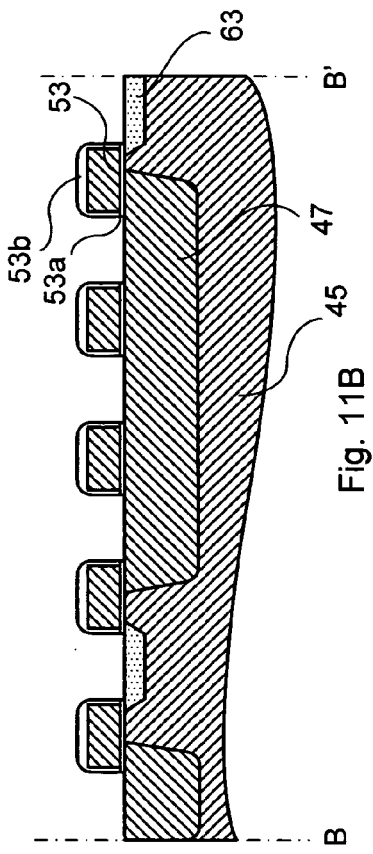
Figure 11B:
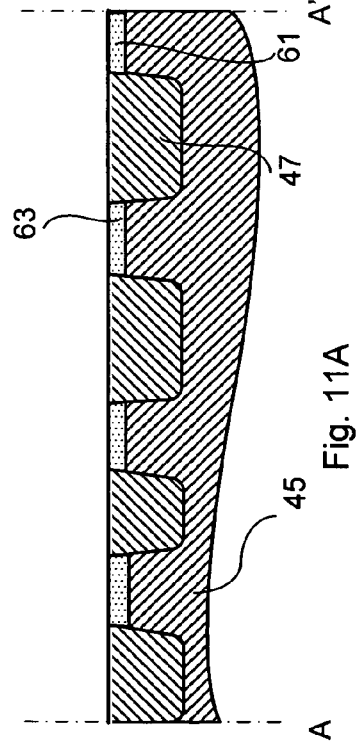

Referring firstly to FIGS. 11A and 11B, an STI etch process is used to create shallow trenches 47 in the silicon substrate 45, which are filled with dielectric material. Areas of the substrate that do not comprise the STI regions define the active regions 43.

Gate insulating layers 53a and word lines 53 are sequentially stacked to form gate stacks on the substrate and STI regions. Gate spacers 53b are formed on the sidewalls and on top of the gate stack. Impurity ions are implanted into the substrate 45 to form source region 61 and drain regions 63 for isolation transistors.

Figure 11C:
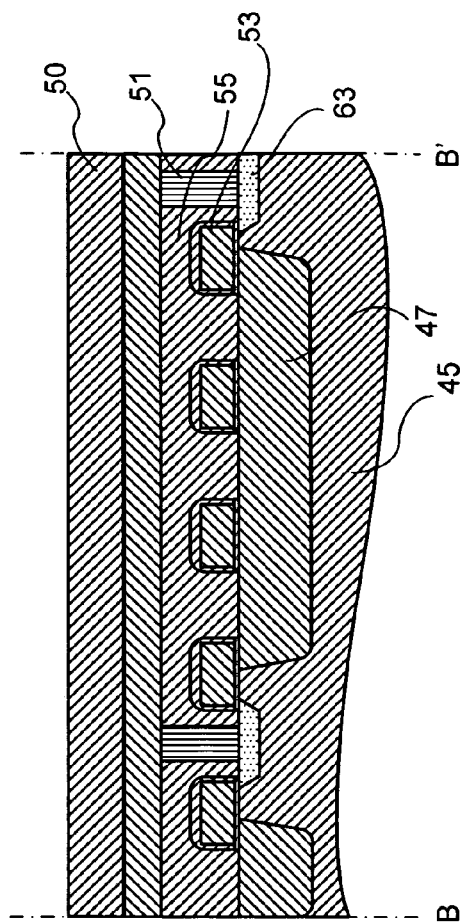
Figure 11D:
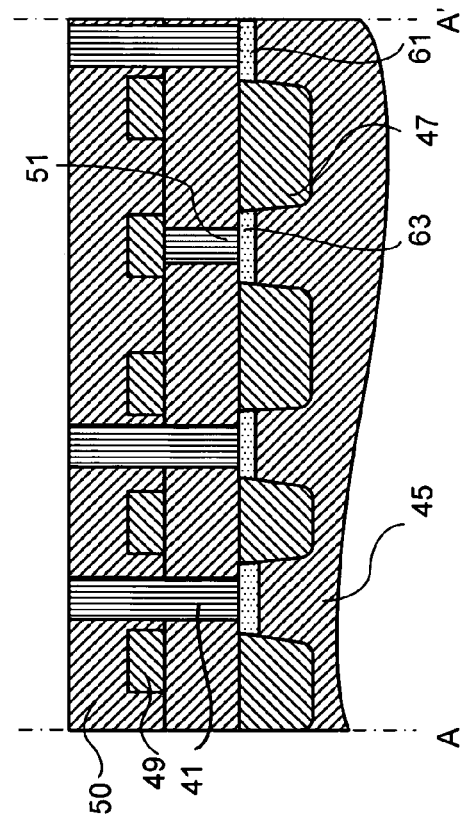

Referring now to FIGS. 11C and 11D, a first insulating matrix 55 is formed on the entire surface of the substrate. The first insulating matrix 55 is successively patterned and etched to open vias 51 that expose a portion of each drain region 63. One or more conductive layers are then formed on the substrate and fill the vias 51. The upper portion of the conductive layer is then removed, typically using a planarisation process, to remove all of the conductive layer except that formed in the vias 51, and expose a top surface of the first insulating matrix 55.

Another conductive layer is then formed on the first insulating matrix 55. The conductive layer is patterned then etched to form sense lines 49 running perpendicular to the word lines and contacting the conductive layer in the via 51. A second insulating matrix 50 is then formed on the structure. In a similar fashion as described above with respect to vias 51, vias 41 are formed in the first insulating matrix and the second insulating matrix to contact the surface of each source region 61.

Referring now to FIGS. 11E and 11F, a conductive layer is formed on the substrate. The conductive layer is then patterned and etched to form bottom electrodes 39 contacting vias 41.

The MTJs 37 are then fabricated according to the following steps.

The buffer layer 89 and the antiferromagnetic pinning layer 87 are deposited in series. The magnetisation of the pinning layer 87 is set by heating it and applying an external magnetic field to it, which is maintained as the pinning layer 87 cools. The first ferromagnetic sub layer 91, antiferromagnetic coupling layer 95 and second ferromagnetic sub-layer 93 are then deposited in series over the pinning layer 87.

The barrier material is then deposited. The can be achieved by r-f sputtering the material, or depositing magnesium and then oxidising the magnesium by a process such as plasma oxidation.

The ferromagnetic free layer 83 is then deposited. The capping layer 82 is deposited on the ferromagnetic free layer 83.

The resulting stack is then patterned into cells to form the MTJs 37. Patterning may be performed by depositing a layer of photoresist on the protective capping layer, using photolithography to pattern the photoresist, and removing the unprotected material.

Referring now to FIGS. 11G and 11H, a third insulating matrix 123 is then formed over the upper surface of the substrate including the MTJ 37. The third insulating matrix 123 is patterned to form a bit line contact holes 125 that exposes the surfaces of the capping layers 82. A conductive layer is then formed on the substrate and in bit line contact holes 125. The conductive layer is then patterned and etched to form bit lines 31 that cover the bit line contact holes 125, and are parallel to the sense lines 49.

A fourth insulating matrix 35 is formed on the entire surface of the substrate. A conductive layer is formed on the substrate, and is subsequently patterned and etched to form assist current lines 33 above and parallel to the bit lines 31.

In the above-described fabrication process, the conductive layers can be formed using a method well known in the art such as chemical vapour deposition, physical vapour deposition, plasma enhanced chemical vapour deposition, or sputtering.

Second Embodiment

Device Layout

Figure 12A:
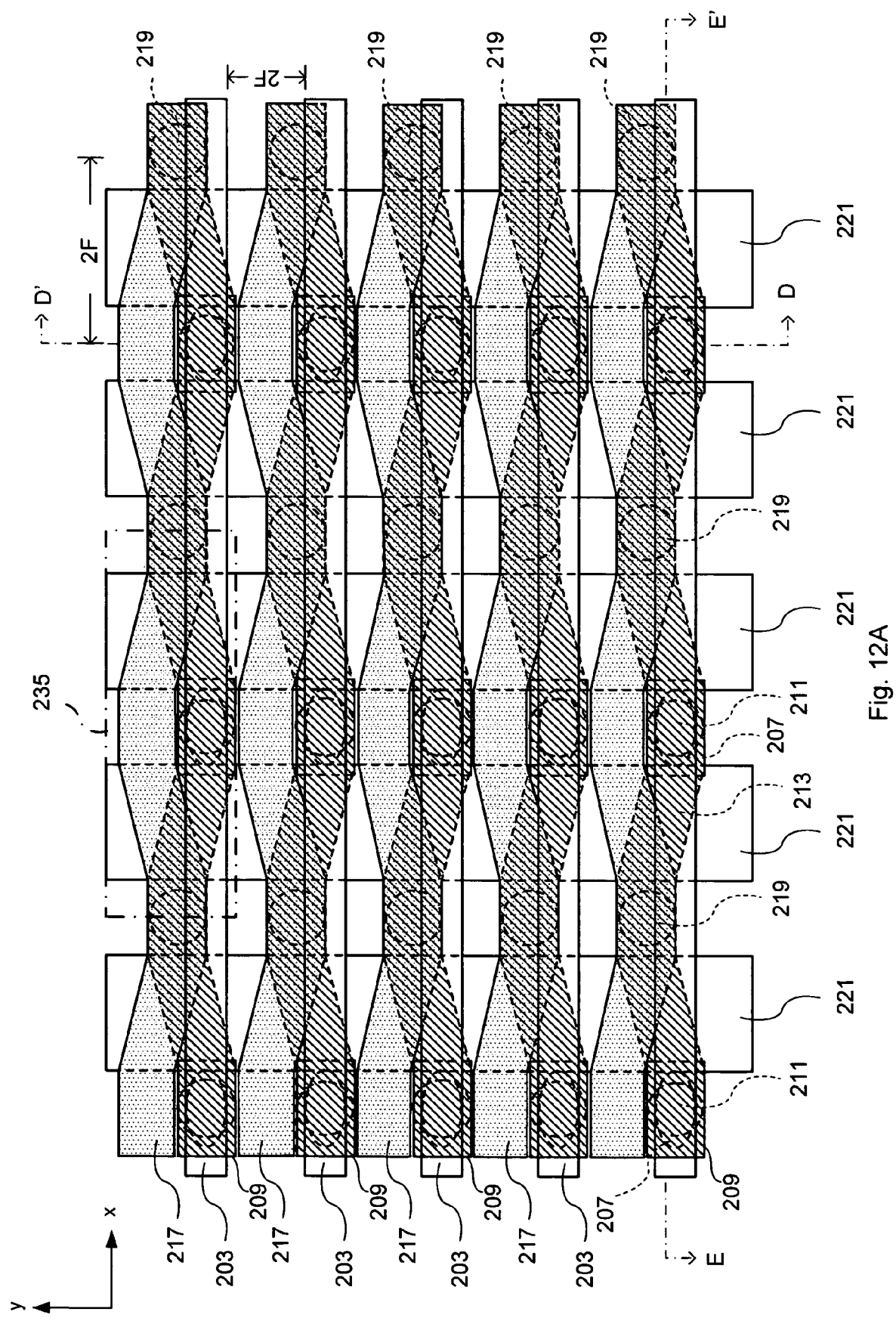
FIG. 12A is a plan view of a memory array comprising a magnetic memory device according to certain embodiments of the present invention.
Figure 12B:
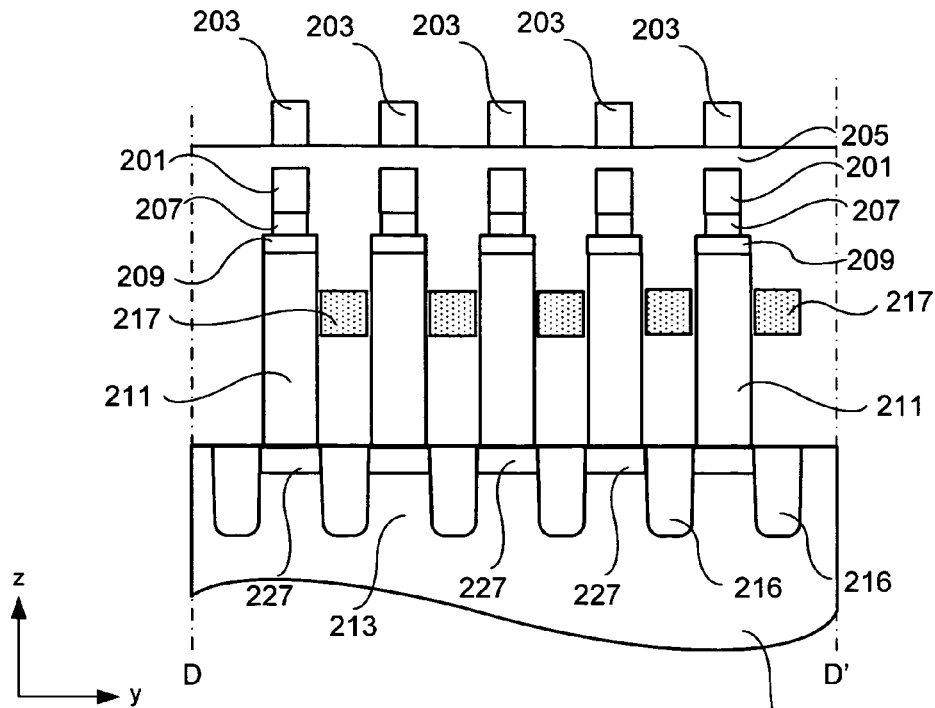
FIG. 12B is a cross section of the memory array shown in FIG. 9A taken along a line D-D'.
Figure 12C:
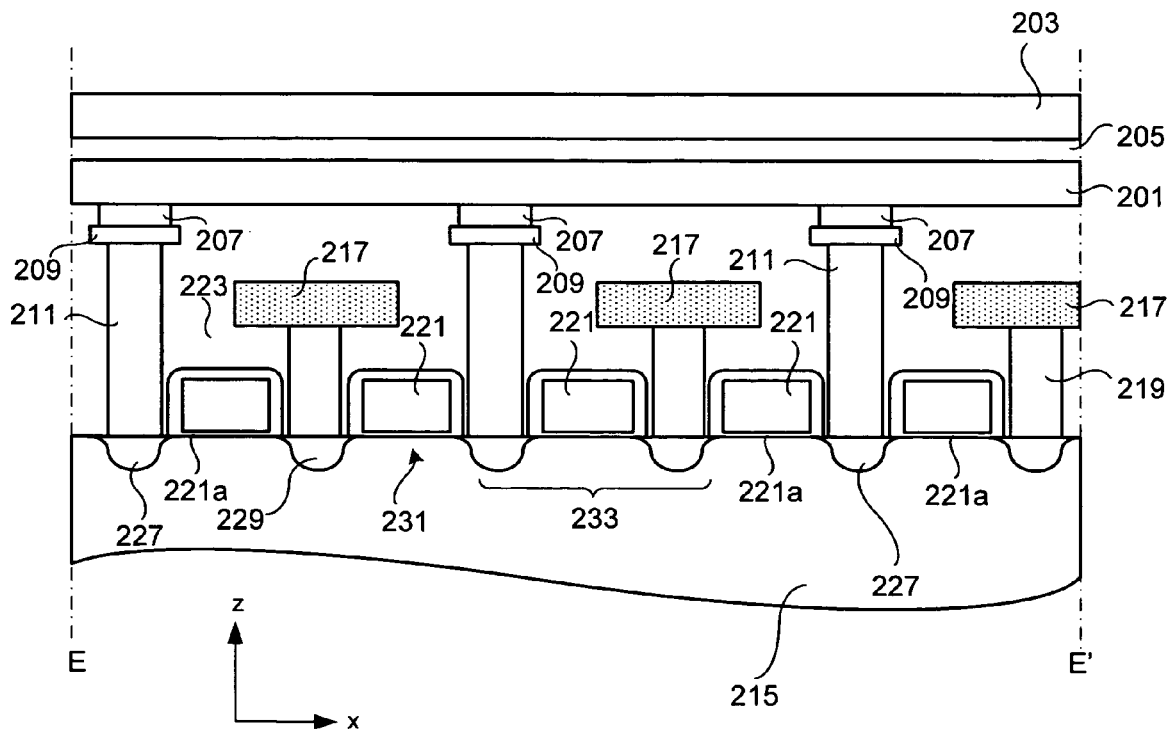
FIG. 12C is a cross section of the memory array shown in FIG. 9A taken along a line E-E'.

Referring to FIGS. 12A to 12C, a second memory array according to certain embodiments of the present invention is shown. The memory array is an MRAM.

Referring in particular to FIG. 12A, a plurality of bit lines 201 are arranged in a first direction, herein defined as the x-axis. The bit lines 201 define a first dimension of the array, in this example, rows of the array. An assist current line 203 overlies each bit lines 201, and is electrically isolated from the respective bit line 201 by an insulating matrix 205.

A plurality of MTJs 207 are provided. The MTJs 207 have the same structure as the MTJs 37 described above with respect the first embodiment. The MTJs 207 are arranged with the magnetic easy axis parallel to the bit lines 201, i.e. parallel to the x-axis.

Referring in particular to FIG. 12B, Each MTJ 207 is connected to the underside of a bit line 201. Thus, the MTJs 207 are electrically isolated from the assist current lines 203.

Referring in particular to FIG. 12A, each MTJ is connected to a bottom electrode 209. The bottom electrode 209 is a rectangle in the x-y plane having long and short sides. The long and short sides of the bottom electrode 209 are approximately the same size as the long and short axes of the MTJ 207.

Referring in particular to FIG. 12B, a via 211 connects each bottom electrode 209 to an active region 213 on a substrate 215.

The active regions 213 are electrically isolated from one another on the substrate 215 by STI regions 216.

Referring in particular to FIG. 12B, a sense line 217 runs underneath each bit line. The sense line 217 does not contact the bit lines 201, the MTJs or the bottom electrodes 209. A via 219 connect the sense line 217 to the active region 213.

Referring in particular to FIG. 12A, each sense line 217 weaves side to side about a longitudinal axis. The longitudinal axis is parallel to the x-axis. Each active region 213 also weaves side to side about a longitudinal axis that is parallel to the x-axis.

The pitch of the weave of the sense line 217 is the same as the pitch of the weave of the active region 213. The weaves are 180° out of phase such that the weave of the sense line 217 and the weave of the active layer 213 coincide at and are contacted by vias 219.

Where the sense line 217 and the active layer 213 are furthest away from each other, the vias 211 connecting the bottom electrodes 209 to the active region 213 are provided. Therefore, the sense line 217 is spaced apart from the vias 211 connecting the bottom electrode 209 to the active region 213.

Referring in particular to FIG. 12C, a plurality of word lines 221 are provided on the substrate 215 and are isolated therefrom by a gate oxide 221a. The word lines 221 are perpendicular to the bit lines 201. The word lines 221 are arranged in a second direction, herein defined as the y-axis. The word lines 221 are isolated from the sense lines by an insulating matrix 223. Each word line 221 is provided between the vias 219 connecting the sense line 217 to the active region 213 and the vias 211 connecting the bottom electrode 209 to the active region 213.

The word lines 221 define a second dimension of the array, in this example, columns of the array. Two word lines 221 are provided for each MTJ 207. Therefore, each column of the array is defined by the two word lines 221 on either side of a column of MTJs 207.

Referring in particular to FIG. 12C, a source region 227 is provided in the active region 213 below each via 211 connecting the bottom electrode 209 to the active region 213. A drain region 229 is provided in the active region 213 below each via 219 connecting the sense line 217 to the active region 213. Conduction between each source region 227 and the drain region 229 occurs through the word line 221 between said regions. Therefore, said word line 221 serves as a gate 231 of an isolation transistor 233.

Two transistors 233 are provided for each MTJ 207, therefore each memory cell 235 is defined by one MTJ 207 and two transistors 233. The drain region 229 of each transistor 233 is shared between neighbouring memory cells 235. The area of each memory cell 235 is 8 $F^2$.

The feature size F of the memory array is between 50 nm and 100 nm.

Figure 13:
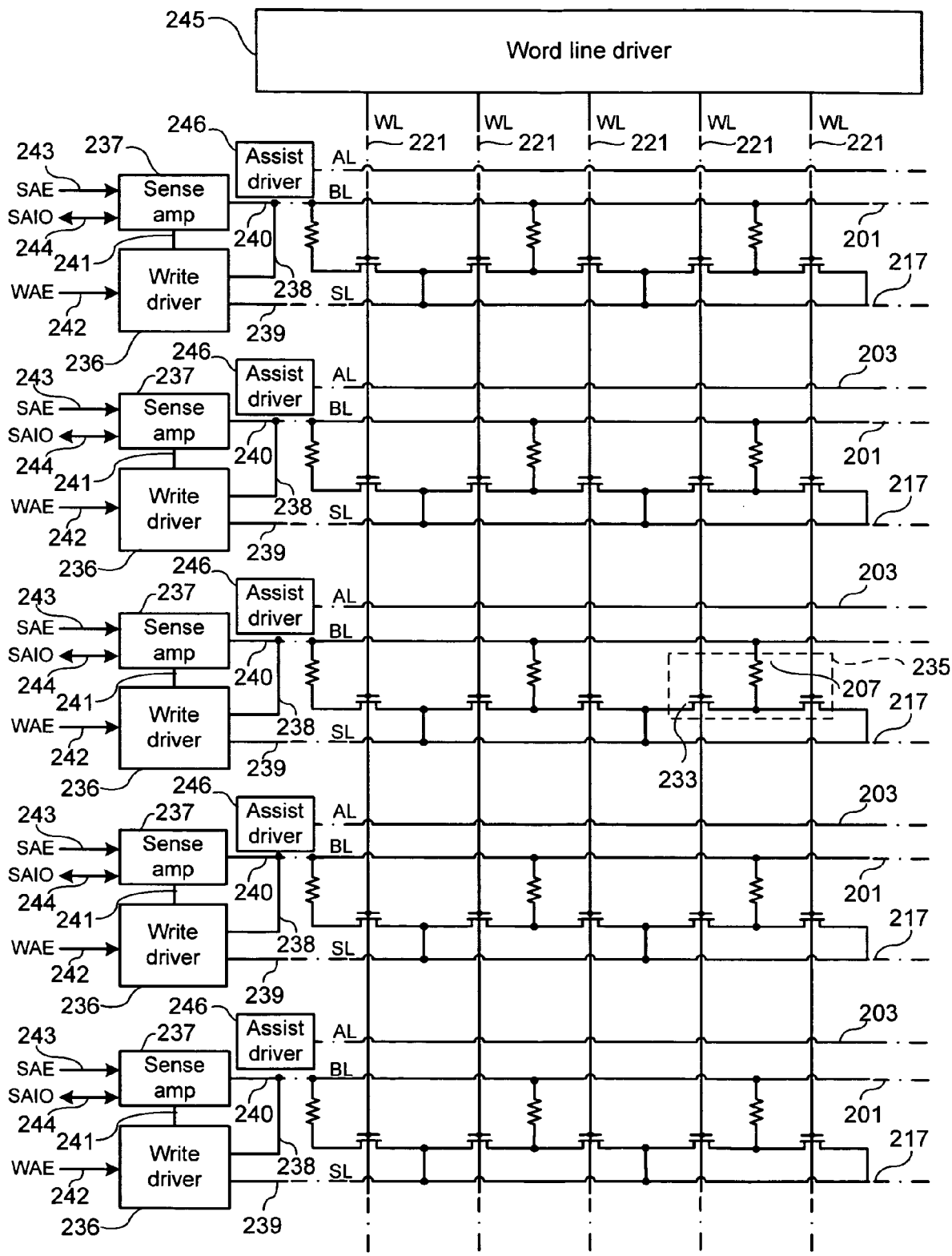
FIG. 13 illustrates control circuitry for the memory array shown in FIG. 9A.

Referring to FIG. 13, control circuitry for the memory array is shown.

A write driver 236 and a sense amplifier 237 are provided for each row of the memory array. Each bit line 201 is connected to a first output 238 of the respective write driver 236. Each sense line 217 is connected to a second output 239 of the respective write driver 237. Each bit line 201 is also connected to a first input/output port 240 of the respective sense amplifier 237.

A connection 241 is provided between a second output of the sense amplifier 237 and a first input of the respective write driver 236.

The write driver 236 has a second input 242 for applying a write amplifier enable (WAE) voltage.

The sense amplifier 237 has a second input 243 for applying a sense amplifier enable (SAE) voltage. The sense amplifier 237 has a third input/output port 244 for applying a sense amplifier input/output (SAIO) voltage.

An assist driver 246 is provided for each row of the array. Each assist driver 246 has a first input connected to an assist current line 203.

A single word line driver 245 is provided. Each word line 221 is connected to a respective output of word line driver 245.

Each MTJ 207 connects a bit line 201 to the sense line 217 in the same row, through one of two isolation transistors 233 either side of the MTJ 207. The base of each isolation transistor 233 is connected to a single word line 221. Current will flow through the MTJ 207 when a bias is applied to both of the word lines 221 defining the column the memory cell 235, and a bias is applied to the bit line 201 or sense line 203 defining the row of the MTJ 207. In this way, each MTJ 207 is addressable by two word lines 221 and a single bit line 201 or sense line 217.

Addressing each MTJ 207 by two word lines 221 reduces the current through the isolation transistors 233. This can be advantageous because the maximum pass current of the isolation transistors 233 places an upper limit on the current that can be used in STT switching.

Device Operation

Reading and writing of the memory cell shown in FIGS. 12A to 12C is the same as that described earlier with respect to the memory cell shown in FIGS. 3A to 3D.

Device Fabrication

The steps of the fabrication process for the memory cell shown in FIGS. 12A to 12C is the same as that described earlier with respect to the memory cell shown in FIGS. 3A to 3D.

Alternative MTJ Structure

Figure 14:
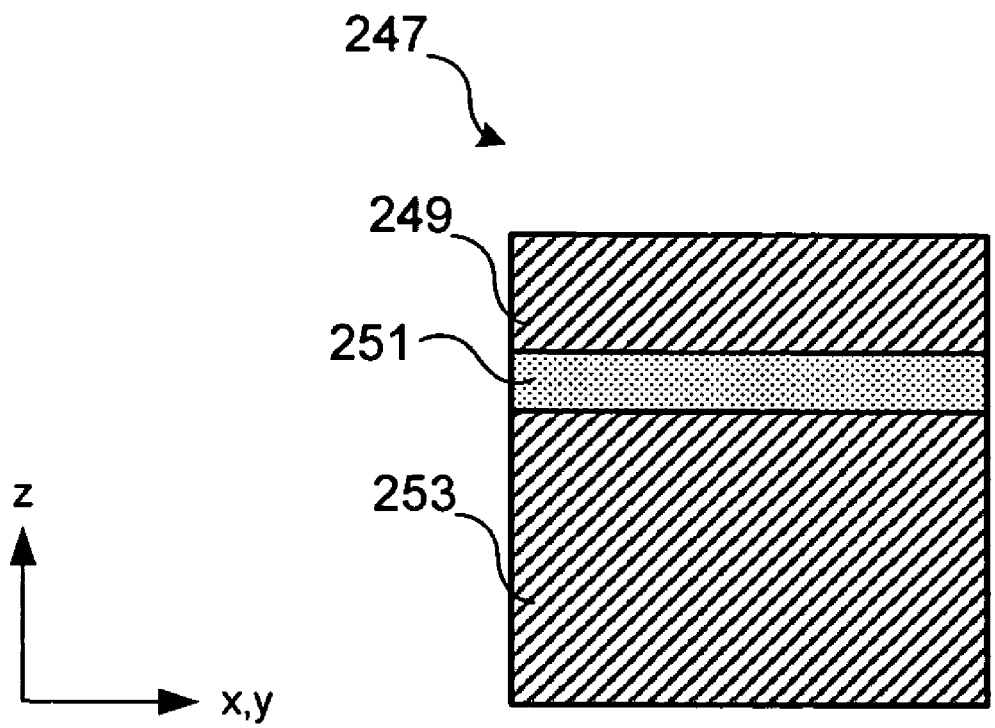
FIGS. 14 and 15 illustrate cross sections of other magnetic tunnel junctions, in accordance with certain embodiments of the present invention.

Referring to FIG. 14, a cross section of an alternative MTJ 247 taken through the x-z plane is shown. The MTJ 247 can be used instead of MTJ 37 in the first embodiment or MTJ 207 in the second embodiment.

The MTJ 247 comprises a sequence of layers, including a free layer 249, a tunnel barrier layer 251, and a pinned layer 253. In this example, the free layer is furthest from the substrate and the pinning layer is closest to the substrate.

The free layer 249 comprises a ferromagnetic material. The free layer 249 has a relatively low coercivity, so that it can be switched on application of a switching current or magnetic field.

The tunnel barrier layer 251 is formed of an insulating material, such as magnesium oxide (MgO), and is sufficiently thin that electrons can tunnel through it.

The pinner layer 253 comprises a ferromagnetic material. The pinned layer 253 is thicker than the free layer 249. This provides it with a higher coercivity than the free layer 249. Therefore, the free layer 249 is able to switch upon the application of the switching current and assist magnetic field, and the pinned layer 253 is not able to switch upon application of the switch current and assist magnetic field.

Figure 15:
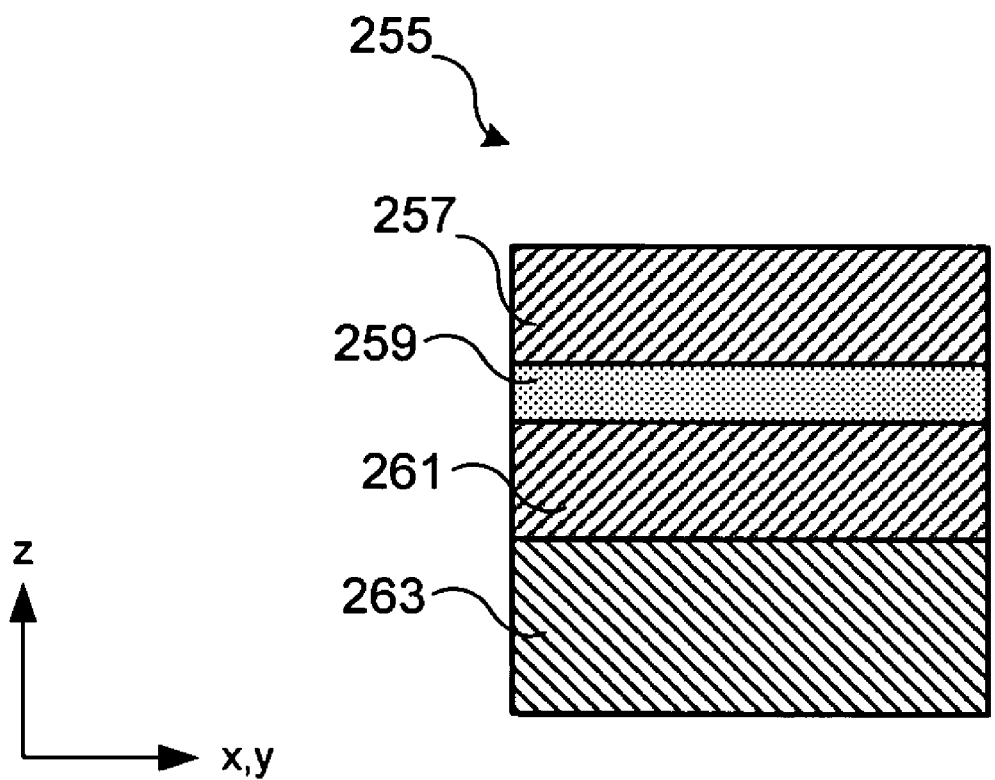

Referring to FIG. 15, a cross section in the x-z plane of another alternative MTJ 255 is shown. The MTJ 255 can also be used instead of the MTJ 37 in the first embodiment or the MTJ 207 in the second embodiment.

The MTJ 255 comprises a sequence of layers, including a free layer 257, a tunnel barrier layer 259, a pinned layer 261, and a pinning layer 263. In this example, the free layer is furthest from the substrate and the pinning layer is closest to the substrate.

The free layer 257 comprises a ferromagnetic material. The free layer 257 has a relatively low coercivity, so that it can be switched on application of a switching current or magnetic field.

The tunnel barrier layer 259 is formed of an insulating material, such as magnesium oxide (MgO), and is sufficiently thin that electrons can tunnel through it.

The pinner layer 261 comprises a ferromagnetic material. The pinned layer 261 has a relatively high coercivity, so that it is not switched on application of a switching current or magnetic field.

The pinning layer 263 comprises an antiferromagnetic material. The pinning layer 263 pins the magnetisation of the pinned layer 261, to prevent the magnetisation of the pinned layer 261 from switching on application of a magnetic field or a switching current.

The alternative MTJs 247, 255 have the advantage of a simpler structure than the MTJ 37 used in the first embodiment and the MTJ 207 used in the second embodiment. Therefore, the alternative MTJs 247,255 are simpler to fabricate. However, the alternative MTJs 247, 255 do not exhibit a magnetoresistance ratio has high as that exhibited as the MTJ 37 and the MTJ 207.

Enhanced Switching

As explained earlier, an assist magnetic field $H_A$ can be used to lower the current $I_{MTJ}$ needed to switch the magnetisation $M_1$ (FIGS. 9A & 9B) in the free layer 83 (FIGS. 9A & 9B).

The switching current $I_{MTJ}$ can be reduced further if the assist field $H_A$ (FIGS. 9A & 9B) is turned on at the same time or shortly before (e.g. no more than about 5 ns) the switching current is turned on. As will be explained in more detail later, even for modest assist fields (e.g. 80 Oe or more), if the current is switched on sufficiently soon after the assist field is switched on, then the switching current can be reduced below the dc threshold current, $I_{c0}$.

In the following description, parallel to antiparallel (P to AP) switching is described. However, it will be understood that the following description also applies to antiparallel to parallel (AP to P) switching.

Figure 16:
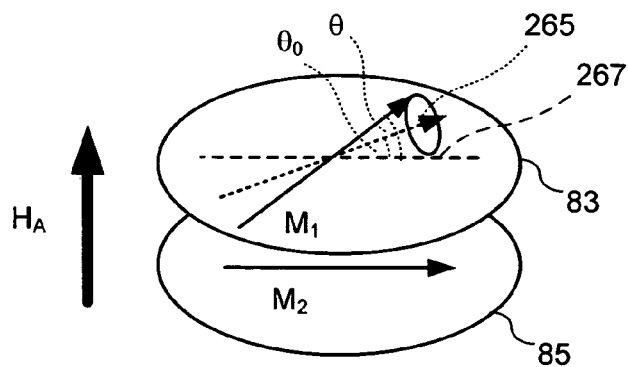
FIG. 16 is schematic illustration of magnetisations of a free layer and a pinned layer in the memory array shown in FIG. 3A when a switching current is applied while magnetisation of the free layer is precessing following application of an assist field.

Referring to FIG. 16, after the assist field $H_A$ is turned on, the magnetisation $M_1$ of the free layer begins to precess around an axis 265 which is inclined with respect to the easy axis 267 at an angle $\theta_0$, where $\theta_0$=arc sin $(H_A/H_k)$ and $H_A$ is the assist field (or a component of the field along the hard axis) and $H_k$ is the anisotropy magnetic field of the free layer 83.

During an initial period when the magnetisation $M_1$ makes its first few turns, the angle $\theta$ between the magnetization $M_1$ and the easy axis 267 of the free layer reaches about $2\theta_0$. However, motion of the magnetization $M_1$ is damped until it becomes is aligned with the axis 265.

The precession period $t_{precess}$ may be found using:

$$t_{precess} = \frac{1}{f_{precess}} = \frac{1}{\frac{g}{2\pi}\sqrt{H_A(H_A + M_S/\mu_0)}} \quad (4)$$

where g is the gyromagnetic constant $(2.2 \times 10^5 \text{ m A}^{-1}\text{s}^{-1})$, $H_A$ is the external field (i.e. assist field), $M_S$ is a saturation magnetisation and $\mu_0$ is the permeability in free space. In this example, $t_{press}$ is about 250 ps.

The damping time $t_{damp}$ may be found using:

$$t_{damp} \approx \frac{1}{2\pi\alpha f} \quad (5)$$

where $\alpha$ is damping constant and f is the frequency of precession caused by turning on the magnetic field (i.e. $f = f_{precess}$). In this example, $\alpha \sim 0.01$ and $t_{damp} \sim 4$ ns.

The Landau-Lifshitz-Gilbert damping constant $\alpha$ (usually referred to simply as the "damping constant") can be found by routine experiment. For example, a resonance curve of magnetic susceptibility can be obtained for a sample of material forming the free layer by exciting the sample using microwaves, while applying a magnetic field and measuring (e.g. transmitted or reflected) microwave intensity. For a fixed field, if frequency is swept, then a resonance may be observed having a maximum at frequency $\omega_0$ and a full width at half maximum (FWHM) of $\Delta\omega$ and the damping constant $\alpha$ is found using $\alpha = \Delta\omega/2\omega_0$. Additionally or alternatively, for a fixed frequency, if magnetic field is swept then a resonance may be observed having a maximum at frequency $H_0$ and a full width at half maximum (FWHM) of $\Delta H$ and the damping constant $\alpha$ is found using $\alpha = \Delta H \cdot \gamma/2\omega_0$, where $\omega_0$ is resonant frequency (found previously) and $\gamma$ is the gyromagnetic constant.

Spin transfer torque increases with $\theta$ and has a maximum at $\theta = 90°$. Thus, spin transfer torque is large during the initial period after the assist field $H_A$ is turned on. Therefore, if the STT switching current is turned on during this initial period before precessional motion of the magnetisation $M_1$ has been damped (i.e. $\Delta t < t_{damp}$), preferably such that the STT switching current has finished rising before the end of the initial period, then spin transfer torque can very effective.

During STT switching process (i.e. after the STT switching current has finished rising), the assist current $I_A$ is switched off to help stabilize motion of the magnetization $M_1$ after STT switching. After the STT switching process ends, the STT switching current is also switched off.

Typically, the STT switching current and its distribution can be reduced below half of that when the assist magnetic field $H_A$ is not used.

Thus, a writing process may be employed having programming frequency of 100 MHz and $t_{W1} = t_{W3} = 1$ ns, $t_{W2} = 0$, $t_{W4} = 3$ ns, $t_{W6} = 9$ ns, $t_{W7} = 10$ ns. Preferably, $0 \leq t_{W2} < t_{W3} < 5$ ns (or $t_{damp}$).

It will be appreciated that the time interval $\Delta t$ to achieve precession-enhanced switching can be less than or greater than 5 ns depending on the values for $t_{precess}$ and $t_{damp}$ and that the time interval is approximately equal to the damping time, i.e. $\Delta t \approx t_{damp} > t_{precess}$.

The time interval $\Delta t$ between turning on the assist current and the switching current can be defined using the feet (e.g. which can be defined as 10% of the maximum value) or the shoulders (e.g. which can be defined as 90% of the maximum value) of the assist and switching currents. As shown in FIGS. 8A and 8B, in this embodiment, the feet of the assist and switching currents are used to define the time interval $\Delta t$.

It will be understood that for switching from AP to P states, the current direction is reversed.

Figure 17:
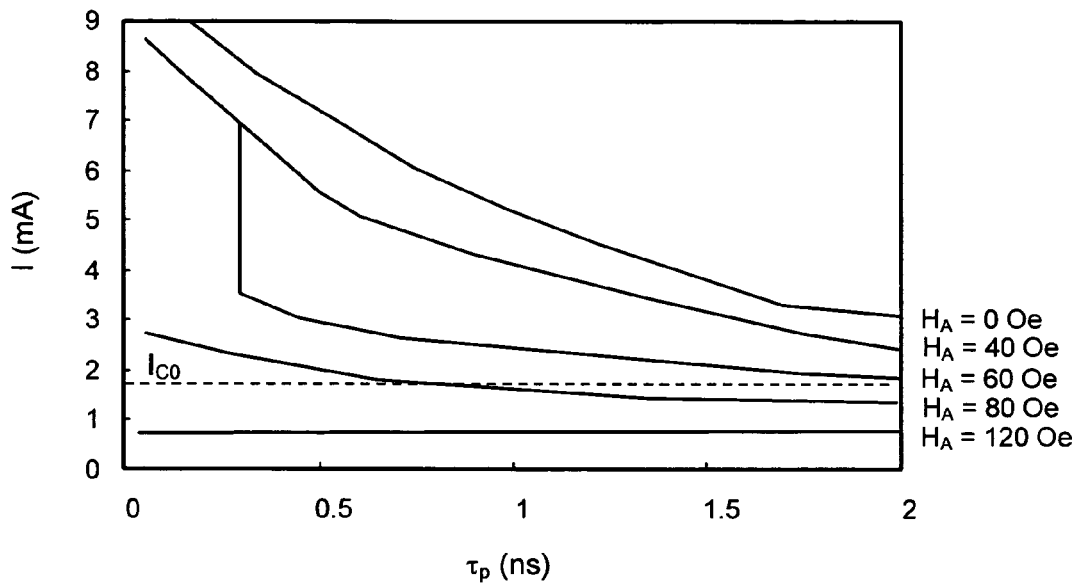
FIG. 17 are plots of minimum current required for parallel to anti-parallel switching for different assist field when then switching current is applied while magnetisation of the free layer is precessing.

Referring to FIG. 17, plots of simulated minimum current required for parallel to anti-parallel switching for different assist fields ($H_A = 0$, 40, 60, 80 and 120 Oe) when the current is applied while magnetisation of the free layer is still precessing (i.e. for $\Delta t < t_{damp}$) at absolute zero are shown.

As shown in FIG. 17, the required current $I_{pusle}$ for switching decreases as the assist field $H_A$ increases. The required $I_{pusle}$ at $H_A$=120 Oe is about half of that at dc and is independent of pulse duration $\tau_p$ (FIGS. 8A & 8B). The results shown in FIG. 17 indicate that the small amplitude approximation used to derive equation 1 above is not available for STT switching under these conditions (i.e. $\Delta t < t_{damp}$).

Figure 18:
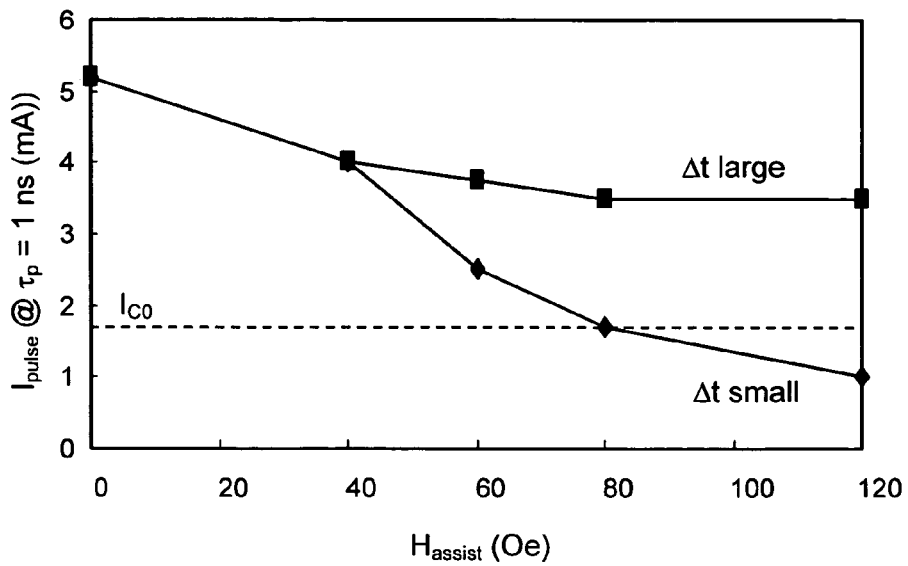
FIG. 18 are plots illustrating current required for parallel to anti-parallel switching in a case when the switching current is applied while magnetisation of the free layer is precessing and in a case when a switching current is applied after the magnetisation has stabilised.

Referring to FIG. 18, plots illustrating simulated current required for parallel to anti-parallel switching in a case when the switching current is applied while magnetisation of the free layer is precessing (i.e. $\Delta t < t_{damp}$) and in a case when the switching current is applied once magnetisation has stabilised (i.e. $\Delta t >> t_{damp}$) are shown.

As shown in FIG. 18, if the switching current is turned on soon after the assist current is switched on (i.e. $\Delta t$ is "small", in other words $\Delta t < t_{damp}$), then the current needed to switch magnetisation can be reduced compared with the case in which there is a longer delay between turning on the switching current and the assist current (i.e. $\Delta t$ is "large", in other words $\Delta t >> t_{damp}$).

In this example, the anisotropy field of the free layer $H_k$ is about 800 Oe. Based on an assist field $H_A$ being about a tenth of the anisotropy field $H_k$, an assist current $I_A$ of a few hundred μA can generate an assist field $H_A$ of about one hundred Oe which is large enough to reduce the switching current below $I_{co}$.

Using a writing process in which the switching current is turned on soon after turning on the assist field can help to reduce further power consumption in MRAM.

The process also helps to reduce the probability distribution of switching in the nanosecond regime. A cause of intrinsic probability distribution in the switching current is the distribution of the initial magnetization direction of the free layer due to the thermal fluctuation. The assist magnetic field helps to fix the direction of the magnetization of the free layer. Therefore, by using an assist magnetic field pulse, the distribution of the switching current can be reduced. This can help to widen the writing current margin in MRAMs.

Preferably, the rise times (e.g. $t_{W1}$ and $t_{W3}-t_{W2}$) should be as short as possible, for example a few hundred pico-seconds or less.

In another example (not shown), the MTJ is provided with an additional ferromagnetic layer overlying the free layer. The additional ferromagnetic layer is separated from the ferromagnetic layer by a non-magnetic conductor. The additional ferromagnetic layer can increase the proportion of spin-polarised electrons injected into the free layer when current flows from the pinned layer to the free layer.

In yet another example (not shown), a spin valve is provided instead of an MTJ. The spin valve comprises a sequence of layers, including a ferromagnetic free layer and a ferromagnetic pinned layer separated by a nonmagnetic conductor.

It will be appreciated that many modifications may be made to the embodiments described above. For example, the strength and width of the assist current pulse can be adjusted depending on the magnetic properties of the free layer. In addition, the orientation of the MTJs with respect to the bit line and sense line can be varied. However, the assist current line should be parallel to the magnetic easy axis of the MTJs.

The invention claimed is:

1. A method of operating a magnetic memory device, the magnetic memory device comprising first and second leads, a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis, and said multilayer structure being switchable between said first and second states, and a magnetic field source for controllably applying a magnetic field along the magnetic hard axis in the ferromagnetic layer independently of current flow through the multilayer structure for assisting switching of the multilayer structure between said first and second states, said method comprising:
   turning on a magnetic field along the magnetic hard axis in the ferromagnetic layer using the magnetic field source, the magnitude of magnetic field in the ferromagnetic layer being 0.1 to 0.2 of the magnitude of an anisotropy magnetic field of the ferromagnetic layer; and
   turning on a current through the magnetoresistance multilayer structure within 2 ns after turning on the magnetic field.

2. A method according to claim 1; a memory comprising:
   a magnetic memory device comprising:
      first and second leads;
      a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis; and
      a magnetic field source for controllably applying a magnetic field along the magnetic hard axis in the ferromagnetic layer independently of current flow through the multilayer structure for assisting switching of the multilayer structure between first and second states; and
   circuitry for controlling the magnetic memory device configured to perform a method according to claim 1.

3. A method of writing to a magnetic memory device, the magnetic memory device comprising first and second leads, a magnetoresistive multilayer structure arranged between said leads, said multilayer structure exhibiting a first, relatively high resistance state and a second, relatively low resistance state, said multilayer structure including a ferromagnetic layer having a magnetic hard axis and a magnetic easy axis, and said multilayer structure being switchable between said first and second states, and a magnetic field source for controllably applying a magnetic field along the magnetic hard axis in the ferromagnetic layer independently of current flow through the multilayer structure for assisting switching of the multilayer structure between said first and second states, said method comprising:
   applying a magnetic field along the magnetic hard axis in the ferromagnetic layer using the magnetic field source, the magnitude of magnetic field in the ferromagnetic layer being 0.1 to 0.2 of the magnitude of an anisotropy magnetic field of the ferromagnetic layer;
   applying a bias between the first lead and the second lead to drive a current through the magnetoresistive multilayer structure;
   removing said magnetic field; and
   removing said bias,
wherein applying the magnetic field occurs within 2 ns before applying the bias.

4. A method according to claim 3, wherein applying the magnetic field occurs at least 1 ns before applying the bias.

5. A method according to claim 3, wherein removing the magnetic field occurs before removing the bias.

6. A method according to claim 3, wherein:
   removing the magnetic field occurs within 3 ns after applying the magnetic field; and
   removing said bias occurs within 6 ns after applying the magnetic field.

* * * * *